(12) United States Patent
O'Donnell et al.

(10) Patent No.: US 12,379,433 B2
(45) Date of Patent: Aug. 5, 2025

(54) MAGNETICALLY SENSITIVE PARTICLES AND MAGNETIC STRUCTURE

(71) Applicant: Analog Devices International Unlimited Company, County Limerick (IE)

(72) Inventors: Alan J. O'Donnell, Castletroy (IE); Javier Calpe Maravilla, Algemesi (ES); Shaun Bradley, Patrickswell (IE); Jan Kubík, Limerick (IE); Jochen Schmitt, Biedenkopf (DE); Stanislav Jolondcovschi, Carlow (IE); Padraig L. Fitzgerald, Mallow (IE); Michael P. Lynch, Bruff (IE); Alfonso Berduque, Crusheen (IE); Gavin Patrick Cosgrave, Enniscorthy (IE); Eoin Edward English, Pallasgreen (IE)

(73) Assignee: Analog Devices International Unlimited Company, Co. Limerick (IE)

( * ) Notice: Subject to any disclaimer, the term of this patent is extended or adjusted under 35 U.S.C. 154(b) by 85 days.

(21) Appl. No.: 18/461,995

(22) Filed: Sep. 6, 2023

(65) Prior Publication Data
US 2024/0085500 A1    Mar. 14, 2024

Related U.S. Application Data

(60) Provisional application No. 63/375,594, filed on Sep. 14, 2022.

(51) Int. Cl.
*G01R 33/12*    (2006.01)
(52) U.S. Cl.
CPC .................. *G01R 33/1276* (2013.01)

(58) Field of Classification Search
CPC ...................... G01R 33/00; G01R 33/0035; G01R 33/0023; G01R 33/0017; G01R 31/3191;
(Continued)

(56) References Cited

U.S. PATENT DOCUMENTS

| 3,956,938 | A | 5/1976 | Carrico |
| 3,970,112 | A | 7/1976 | Bernard |

(Continued)

FOREIGN PATENT DOCUMENTS

| CN | 102737803 | 10/2012 |
| CN | 1041133606 | 11/2014 |

(Continued)

OTHER PUBLICATIONS

Adeyiga et al., "Magnetic microparticle concentration and collection using a mechatronic magnetic ratcheting system", PLOS ONE, Feb. 18, 2021, pp. 1-15.

(Continued)

*Primary Examiner* — Jermele M Hollington
*Assistant Examiner* — Taqi R Nasir
(74) *Attorney, Agent, or Firm* — Knobbe, Martens, Olson & Bear, LLP

(57) ABSTRACT

Aspects of this disclosure relate to particles that can move in response to a magnetic field. A system can include a container, particles within the container, and a magnetic structure integrated with the container. The magnetic structure can magnetically interact with both an external magnetic field and the particles. Related methods are disclosed including magnetic field detection methods based on detection of particles within a container.

20 Claims, 21 Drawing Sheets

(58) Field of Classification Search
CPC .... G01R 33/1276; G01B 7/004; G01C 17/38; G06F 3/017; G06F 3/0346; G06F 3/012

See application file for complete search history.

(56) References Cited

U.S. PATENT DOCUMENTS

| | | | |
|---|---|---|---|
| 4,686,469 | A | 8/1987 | Lewis |
| 4,906,877 | A | 3/1990 | Ciaio |
| 5,502,378 | A | 3/1996 | Atteberry et al. |
| 6,159,378 | A | 12/2000 | Holman et al. |
| 6,392,562 | B1 | 5/2002 | Boston et al. |
| 6,623,984 | B1 | 9/2003 | Fleischman et al. |
| 6,764,861 | B2 | 7/2004 | Prinz et al. |
| 6,982,501 | B1 | 1/2006 | Kotha et al. |
| 7,446,524 | B2 | 11/2008 | Tondra |
| 7,575,934 | B2 | 8/2009 | Atwood |
| 7,609,054 | B2 | 10/2009 | Tondra et al. |
| 7,892,856 | B2 | 2/2011 | Grate et al. |
| 8,011,424 | B2 | 9/2011 | Murray |
| 8,190,372 | B2 | 5/2012 | Kahlman et al. |
| 8,283,912 | B2 | 10/2012 | Nieuwenhuis et al. |
| 8,339,370 | B2 * | 12/2012 | Yun .................. G06F 3/016 345/173 |
| 8,400,410 | B2 | 3/2013 | Taylor et al. |
| 8,453,505 | B2 | 6/2013 | Erdler et al. |
| 8,689,981 | B2 | 4/2014 | Stone et al. |
| 8,779,532 | B2 | 7/2014 | O'Donnell et al. |
| 8,815,610 | B2 | 8/2014 | Berman et al. |
| 9,041,150 | B2 | 5/2015 | O'Donnell et al. |
| 9,098,141 | B2 | 8/2015 | Ciesla et al. |
| 9,103,824 | B2 | 8/2015 | Ovsyanko |
| 9,157,891 | B2 | 10/2015 | Ovsyanko et al. |
| 9,304,131 | B2 | 4/2016 | Ovsyanko |
| 9,678,064 | B2 | 6/2017 | Djennati et al. |
| 9,737,244 | B2 | 8/2017 | Ziaie et al. |
| 9,786,969 | B2 | 10/2017 | Masias |
| 9,841,421 | B2 | 10/2017 | Dittmer et al. |
| 9,999,369 | B2 | 6/2018 | Ziaie et al. |
| 10,092,903 | B2 | 10/2018 | Prins et al. |
| 10,145,906 | B2 | 12/2018 | O'Donnell et al. |
| 10,620,151 | B2 | 4/2020 | Berduque et al. |
| 10,627,269 | B2 | 4/2020 | Mazumdar et al. |
| 10,730,743 | B2 | 8/2020 | Kierse et al. |
| 10,733,906 | B2 | 8/2020 | Pascall |
| 10,809,195 | B2 | 10/2020 | Krishnamoorthy et al. |
| 10,967,122 | B2 | 4/2021 | Cima |
| 11,035,498 | B2 | 6/2021 | Alfadhel et al. |
| 11,085,554 | B2 | 8/2021 | Mou et al. |
| 11,119,161 | B2 | 9/2021 | Iwasaki et al. |
| 11,127,716 | B2 | 9/2021 | McGeehan et al. |
| 11,214,061 | B2 | 1/2022 | Glusti et al. |
| 11,228,310 | B2 | 1/2022 | Zhao et al. |
| 11,231,635 | B2 | 1/2022 | Moon et al. |
| 11,307,055 | B2 | 4/2022 | Schmitt |
| 11,363,427 | B2 | 6/2022 | Volkerink et al. |
| 11,525,820 | B2 | 12/2022 | Meier et al. |
| 11,666,913 | B2 | 6/2023 | Beaumont et al. |
| 11,735,349 | B2 | 9/2023 | Sturcken et al. |
| 2003/0000833 | A1 | 1/2003 | Mansouri et al. |
| 2008/0060710 | A1 | 3/2008 | Carlson et al. |
| 2008/0128391 | A1 | 6/2008 | Chen et al. |
| 2011/0206560 | A1 | 8/2011 | Neijzen et al. |
| 2011/0304326 | A1 | 12/2011 | Sandhu |
| 2013/0105581 | A1 * | 5/2013 | Kwon .................. G06K 19/022 235/493 |
| 2016/0064126 | A1 | 3/2016 | Timonen et al. |
| 2017/0328931 | A1 | 11/2017 | Zhang et al. |
| 2019/0135614 | A1 | 5/2019 | Kierse et al. |
| 2020/0072783 | A1 * | 3/2020 | Berney ............... G01N 27/414 |
| 2021/0148850 | A1 | 5/2021 | Berduque et al. |
| 2021/0262973 | A1 | 8/2021 | Berduque et al. |
| 2021/0322681 | A1 | 10/2021 | Bolognia et al. |
| 2022/0362778 | A1 | 11/2022 | Foster et al. |
| 2023/0098962 | A1 | 3/2023 | O'Donnell et al. |
| 2023/0152166 | A1 | 5/2023 | O'Donnell et al. |
| 2023/0264198 | A1 | 8/2023 | O'Donnell et al. |
| 2023/0349987 | A1 | 11/2023 | O'Donnell et al. |
| 2023/0383855 | A1 | 11/2023 | O'Donnell et al. |
| 2024/0044725 | A1 | 2/2024 | O'Donnell et al. |
| 2024/0044726 | A1 | 2/2024 | O'Donnell et al. |

FOREIGN PATENT DOCUMENTS

| | | |
|---|---|---|
| CN | 205404333 | 7/2016 |
| CN | 108957365 | 12/2018 |
| CN | 111600456 | 8/2020 |
| CN | 110671957 | 5/2021 |
| FR | 2671870 | 7/1992 |
| KR | 1020150088682 | 8/2015 |
| WO | WO 2006/122203 | 11/2006 |
| WO | WO 2021/081103 | 4/2021 |

OTHER PUBLICATIONS

Al-Hetlani et al., "Continuous magnetic droplets and microfluidics: generation, manipulation, synthesis, and detection", Microchim Acta, 186, 55, 2019.

Berkelman et al., "Electromagnetic Haptic Feedback System for Use With a Graphical Display Using Flat Coils and Sensor Array", IEEE Robotics and Automation Letters, Apr. 2020, vol. 5, No. 2, pp. 1618-1625.

Boehler et al., "Sensors in the Autoclave-Modelling and Implementation of the IoT Steam Sterilization Procedure Counter", Sensors, 2021, 21(510) 1-17.

Bruls et al., "Rapid integrated biosensor for multiplexed immunoassays based on actuated magnetic nanoparticles", Lab Chip, 2009, pp. 3504-3510.

Cao et al., "Recent advances in manipulation of micro- and nano-objects with magnetic fields at small scales", Materials Horizons, 2020, 7, pp. 638-666.

Campos et al., "Technologies applied in the monitoring and control of the temperature in the Cold Chain", IEEE, 2018, in 6 pages.

Chae et al., "Bimodal neural probe for highly co-localized chemical and electrical monitoring of neural activites in vivo", Biosensors and Bioelectronics, 2021, vol. 191, pp. 1-11.

Chihiro et al., "Development of Molecular Interaction Assay Using Magneto-Resistance Sensor", The 42nd Annual Meeting of the Molecular Biology Society of Japan, Dec. 2019.

Datta, P., "Magnetic Gels", Polymeric Gels, 2018, pp. 441-465.

D'Uva et al., "Batteryless Wireless Temperature/Humidity Sensor for Item-level Smart Pharma Packaging", IEEE, 2021, pp. 145-149.

Gaster et al., "Matrix-insensitive protein assays push the limits of biosensors in medicine", Nature Medicine, Nov. 2009, 15(11): 1327-1333.

Germano et al., "A Portable and Autonomous Magnetic Detection Platform for Biosensing", Sensors, May 27, 2009, 9:4119-4137.

Gomez-Pastora et al., "Optimization of Magnetic Blood Cleansing Microdevices", Microfluidics Archives—Flow-3D, pp. 1-24.

Hellebrekers et al., "Soft Magnetic Skin for Continuous Deformation Sensing", Advanced Intelligent Systems, Jul. 25, 2019, 1900025, pp. 1-6.

Ji et al., "An Online Cold-Chain Monitoring System Powered by Miniature Smart Tag and Blockchain", IEEE 5th International Conference on Universal Village, 2020, in 5 pages.

Juncker et al., "Cross-reactivity in antibody microarrays and multiplexed sandwich assays: shedding light on the dark side of multiplexing", Current Opinion in Chemical Biology, 2014, vol. 18, pp. 29-37.

Kabe et al., "Application of high-performance magnetic nanobeads to biological sensing devices", Analytical and Bioanalytical Chemistry, Jan. 9, 2019, 411:1825-1837.

Le et al., "Inkjet-Printed Graphene for Flexible Micro-Supercapacitors", IEEE, Aug. 15-18, 2011, pp. 67-71.

Lee et al., "Experimental Investigation of Magnetic Particle Movement in Two-Phase Vertical Flow under an External Magnetic Field Using 2D LIF-PIV", Applied Sciences, Jun. 8, 2020, 10, 3976, pp. 1-17.

(56) References Cited

OTHER PUBLICATIONS

Lee et al., "Thermomagnetic Convection of Ferrofluid in an Enclosure Channel with an Internal Magnetic Field", Micromachines, Aug. 21, 2019, 10, 553, pp. 1-8.

"Magnetic Separation of Sepsis Pathogen Out of Infected Blood" Medgadget Editors, Mar. 25, 2009.

Maity et al., "Manipulation of Magnetic Properties by Tunable Magnetic Dipoles in a Ferromagnetic Thin Film", IEEE Magnetic Letters, Mar. 21, 2017, vol. 8, in 4 pages.

Mohapatra et al., "Electric Stimulus-Responsive Chitosan/MNP Composite Microbeads for Drug Delivery System", IEEE Transactions on Biomedical Engineering, Jan. 2020, vol. 67, No. 1, pp. 226-233.

Mohammadi et al., "Fingertip Force Estimation via Inertial and Magnetic Sensors in Deformable Object Manipulation" IEEE, Apr. 8-11, 2016, pp. 284-289.

Ngyuen, N.T., "Micro-magnetofluidics: Interactions between magnetism and fluid flow on the microscale", Microfluidics and Nanofluidics, Nov. 16, 2011, in 17 pages.

Osterfeld et al., "MagArray Biochips for Protein and DNA Detection with Magnetic Nanotags: Design, Experiment, and Signal-to-Noise Ratio", Chapter 15 of Microarrays, 2008, pp. 299-314.

"Polystyrene Magnetic Particles", MagSphere Inc., 2021.

Rife et al., "Design and performance of GMR sensors for the detection of magnetic microbeads in biosensors", For Sensors and Actuators A, Mar. 19, 2003, in 34 pages.

Shafiq et al., "A Battery-Free Temperature Sensor With Liquid Crystal Elastomer Switching Between RFID Chips", IEEE Access, May 21, 2020, vol. 8, pp. 87870-87883.

Shanko et al., Microfluidic Magnetic Mixing at Low Reynolds Numbers and in Stagnant Fluids, Micromachines, Oct. 29, 2019, 10, 731, pp. 1-23.

Sigma-Aldrich, List of Polystyrene Products, available at: https://www.sigmaaldrich.com/US/en/search/polystyrene?focus=products&page=1&perpage=30&sort=relevance&term=polystyrene&type=product (accessed Oct. 1, 2021).

Tian, B., "Magnetic Nanoparticle Based Biosensors for Pathogen Detection and Cancer Diagnostics", Digital Comprehensive Summaries of Uppsala Dissertations from the Faculty of Science and Technology 1647, May 4, 2018, in 56 pages.

"Use of Paraffin Wax with Different Melting Points", King Honor International, Jun. 17, 2019.

Wang et al., "A Mechanically Tunable Artificial Magnetic Conductor using 3-D Printing Technology", IEEE, Sep. 25-27, 2018, in 4 pages.

Wang et al., "Advances in Giant Magnetoresistance Biosensors With Magnetic Nanoparticle Tags: Review and Outlook", IEEE, Jul. 2008, 44(7): 1687-1702.

Wanganoo et al., "Real-Time Data Monitoring in Cold Supply Through NB-Iot", IEEE, Jul. 1-3, 2020, in 6 pages.

Xu et al., "Giant magnetoresistive biochip for DNA detection and HPV genotyping", Biosensors and Bioelectronics, Sep. 15, 2008, vol. 24, pp. 99-103.

Xu et al., "Giant Magnetoresistive Sensors for DNA Microarray", IEEE, Nov. 2008, 44(11): 3989-3991.

Yu et al., "Giant magnetoresistive biosensors for molecular diagnosis: surface chemistry and assay development", Proceedings of SPIE 7035, Biosensing, Aug. 29, 2008.

Yu et al., "Magnetic sensors as a novel multiplex immunoassay platform with high sensitivity", MagArray.

Yu et al., "Sensitive detection of cTnl in whole blood on MagArray biosensors", MagArray.

Yu et al., "Multiplex Autoantibody Detection Using MagArray GMR Biosensors", MagArray.

Yunas et al., "Polymer-Based MEMS Electromagnetic Actuator for Biomedical Application: A Review", Polymers, May 22, 2020, 12, 1184, pp. 1-21.

Yasui et al., "Magnetic Micro Actuator with Neutral Buoyancy and 3D Fabrication of Cell Size Magnetized Structure" IEEE, May 14-18, 2012, pp. 745-750.

Zhang et al., "A perspective on magnetic microfluidics: Towards an intelligent future", Biomicrofluidics, 2022, vol. 16, in 9 pages.

Zheng et al., "A Disposable Array Chip using Temperature-Responsive Color Change to Record Temperature History In Terminal Cold Chain Transportation", IEEE, Jun. 23-27, 2019, pp. 1941-1944.

Zhou et al., "Self-powered Continuous Time-Temperature Monitoring for Cold-Chain Management", IEEE, 2017, pp. 879-882.

\* cited by examiner

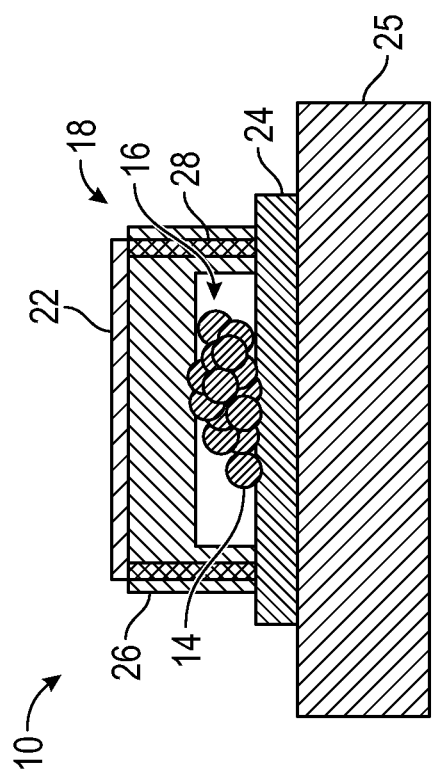
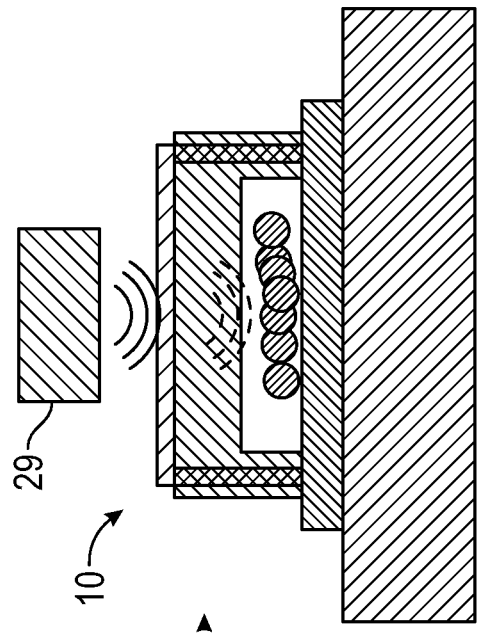
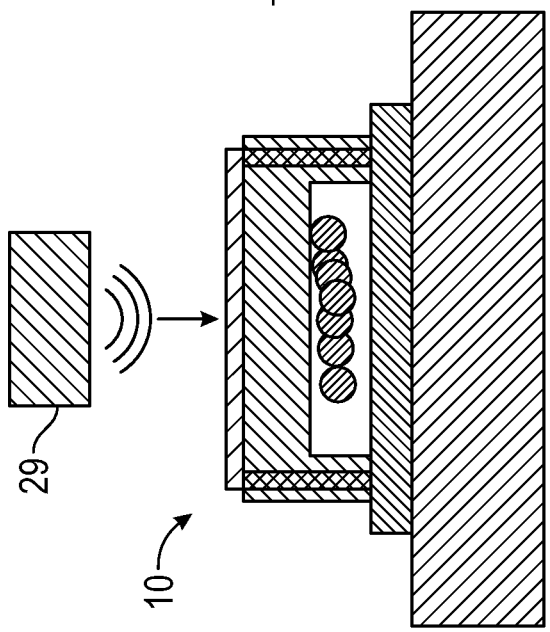
FIG. 1A
FIG. 1B
FIG. 1C

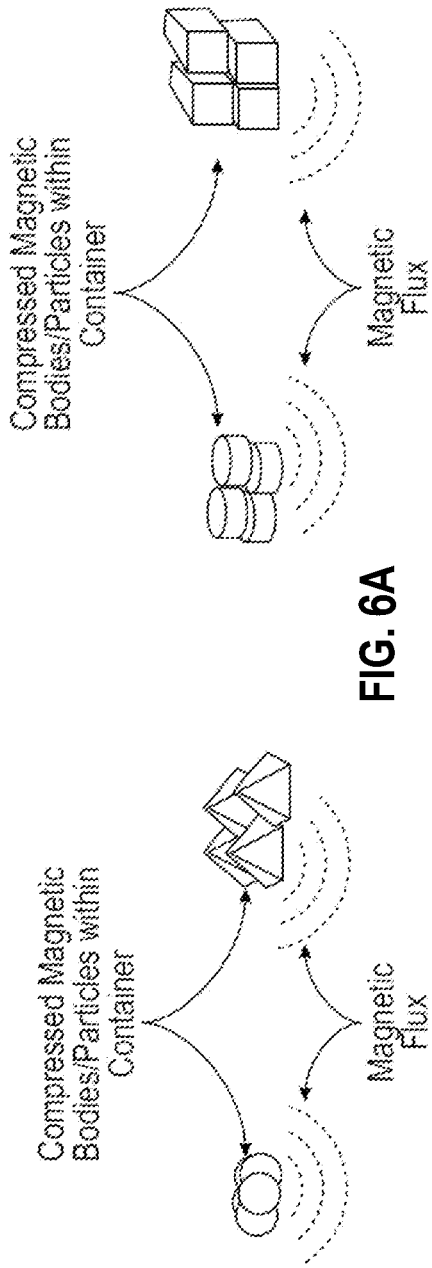
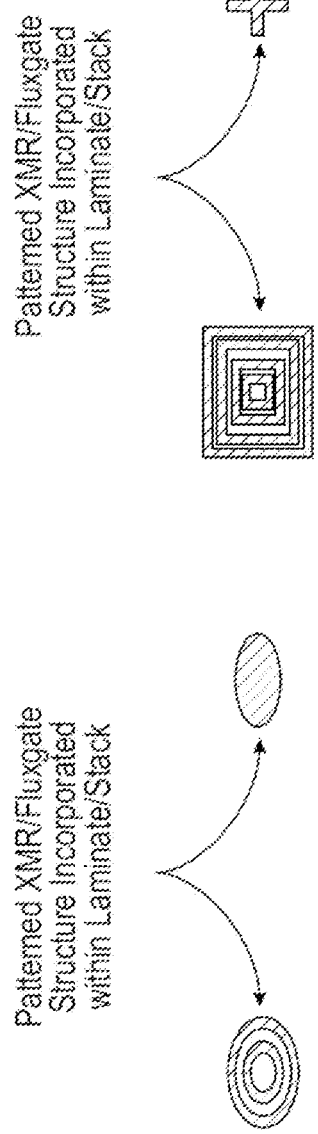
FIG. 6A
FIG. 6B

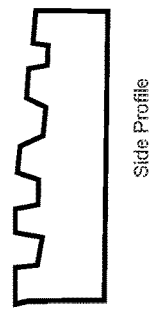
FIG. 7A
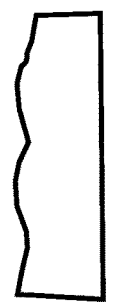
FIG. 7B
FIG. 7C
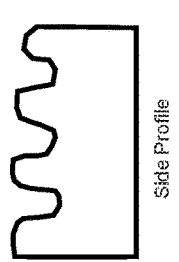
FIG. 7D
FIG. 7E
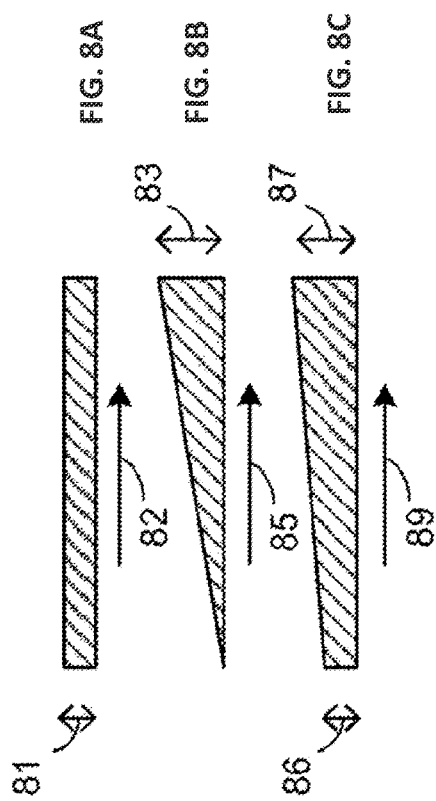
FIG. 8A
FIG. 8B
FIG. 8C

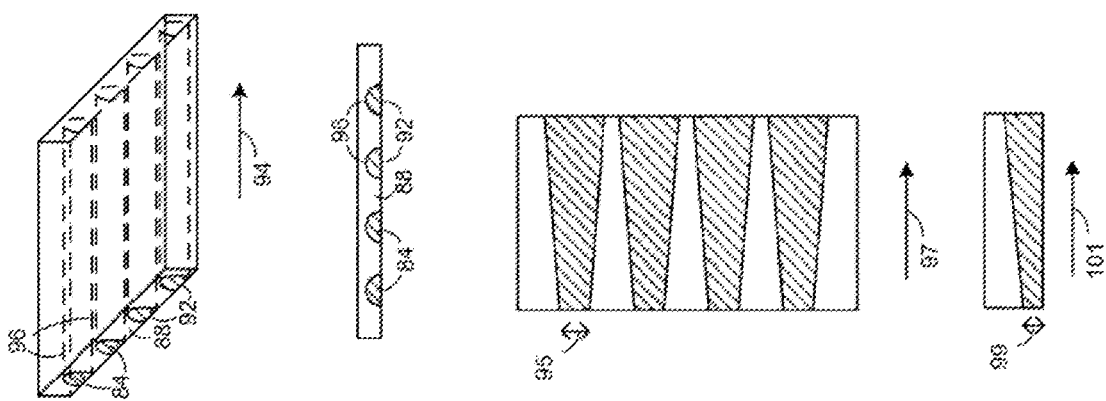

Plan View

Plan View

Plan View

Plan View

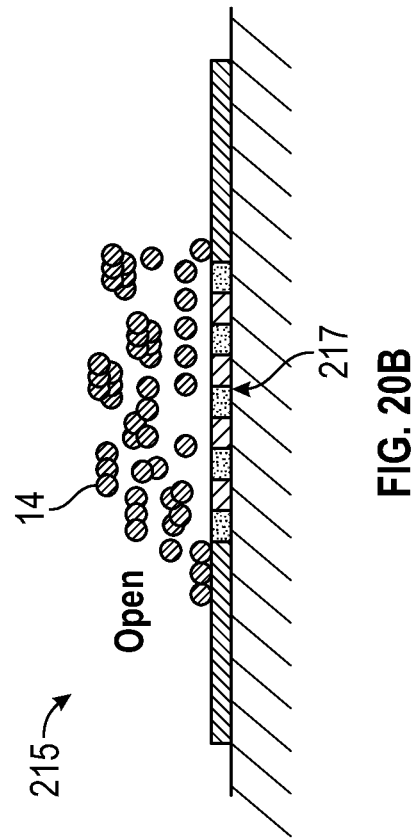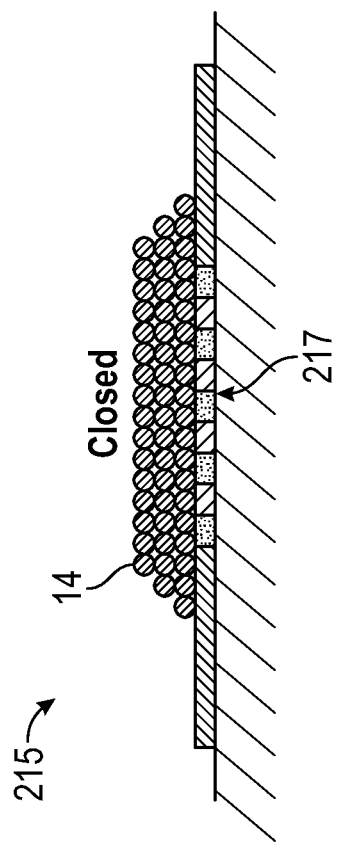

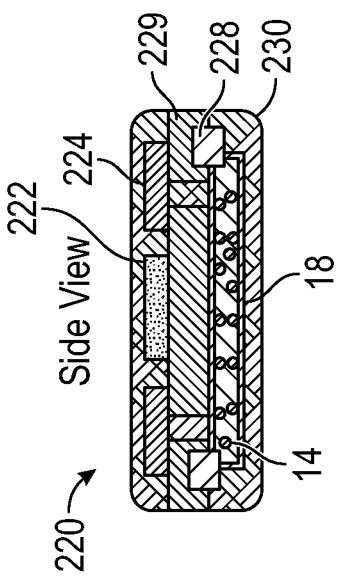
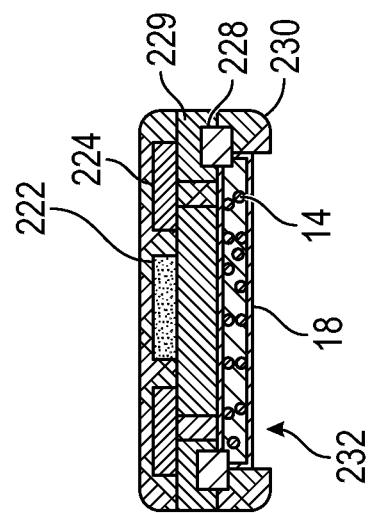
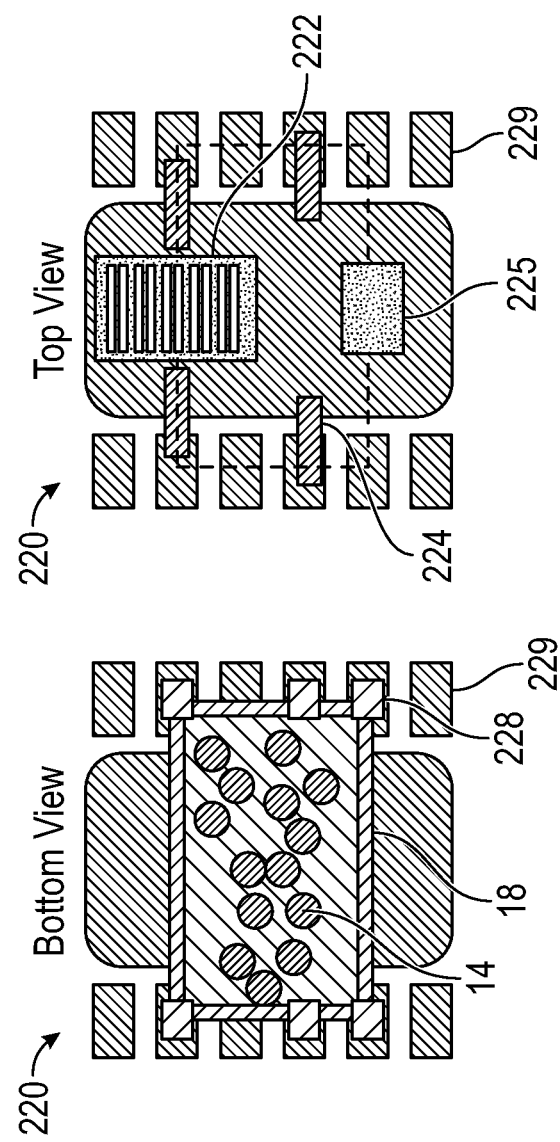

MAGNETICALLY SENSITIVE PARTICLES AND MAGNETIC STRUCTURE

CROSS REFERENCE TO RELATED APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/375,594, filed Sep. 14, 2022 and titled "MAGNETICALLY SENSITIVE PARTICLES AND MAGNETIC STRUCTURE," the disclosure of which is hereby incorporated by reference in its entirety and for all purposes.

BACKGROUND

Technical Field

Embodiments of the disclosed technology relate to particles in a container and magnetic structures.

Description of Related Technology

Magnetic fields can be detected in a variety of applications. Sensing magnetic fields can be used for a variety of purposes. Certain magnetic field sensors are manufactured with semiconductor fabrication processes. Some magnetic field sensors can also be constructed by adding additional layers post wafer fabrication or by attaching or depositing or bonding additional structures or laminates/layers incorporating magnetic materials onto semiconductors. Such magnetic field sensors can be packaged with other semiconductor circuitry.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a system with particles that move in response to a magnetic field. The system includes a container, particles within the container, and a magnetic structure integrated with the container. The magnetic structure is configured to magnetically interact with both an external magnetic field and the particles.

The magnetic structure can be a flux concentrator. The magnetic structure can be configured to amplify the external magnetic field. The magnetic structure can be a biasing magnet configured to hold the particles in position. The system can include a semiconductor die integrated with the container.

The container can include a cap. The magnetic structure can be positioned on the cap. A packaged module can include the container and the magnetic structure, and the magnetic structure can be exposed to an environment external to the packaged module. The system can include a magnetic sensing structure configured to detect the particles and to output an indication of the external magnetic field.

The system can include a magnetic sensing structure configured to detect the particles and to output an indication of the external magnetic field. The system can include an optical sensor configured to detect the particles and to output an indication of the external magnetic field.

The particles can have a functional coating. The particles can be in a fluid. The particles can be in a gel.

The container can include an electrical connection between an internal surface of the container and external to the container. The system can include a sensor and an aperture that exposes at please a portion of the sensor to the external magnetic field. The container can have a shape to enhance physical resetting of the particles.

The system can include an antenna configured to wirelessly transmit a signal associated with the external magnetic field.

Another aspect of this disclosure is a method of magnetic field detection. The method includes modifying an external magnetic field with a magnetic structure that is integrated with a container, where magnetically sensitive particles within the container move in response to the modified magnetic field; after the modifying, detecting the magnetically sensitive particles within the container; and outputting a signal indicative of the external magnetic field based on the detecting.

The modifying can include concentrating magnetic flux of the external magnetic field.

The detecting can be performed with a magnetic sensing structure that is integrated with the container.

The container can include a cap, and the magnetic structure can be positioned on the cap. The container and the magnetic structure can be included in a packaged module, and the magnetic structure can be exposed to an environment external to the packaged module.

The magnetically sensitive particles can have a functional coating.

The signal indicative of the external magnetic field can be indicative of at least one of an intensity of the external magnetic field, a direction of the external magnetic field, or a position of a magnetic body that generates the external magnetic field.

The method can include resetting positions of the magnetically sensitive particles after the detecting.

The outputting can include wireless transmission of the signal from at least one antenna.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 1A, 1B, and 1C are schematic side or cross-sectional views of a sensing system that includes magnetically sensitive particles according to an embodiment.

FIG. 6A illustrates example compressed magnetic bodies and/or particles within a container according to embodiments.

FIG. 6B illustrates example magnetic sensors included within systems that can detect magnetically sensitive particles according to embodiments.

FIGS. 7A, 7B, 7C, 7D, and 7E illustrate example side profiles of magnetic structures according to embodiments.

FIGS. 8A, 8B, and 8C illustrate cross-sectional side views of embodiments of patterned layers having selected height characteristics perpendicular to a plane in which the perimeter, boundary or shape of the layer is defined according to embodiments.

FIGS. 9A and 9B illustrate perspective and cross-sectional side views, respectively, of an embodiment of a patterned layer of material formed in an integral manner with another layer of material. FIGS. 9C and 9D illustrate other embodiments of a composite layer that includes patterned magnetic material.

FIG. 10A illustrates a cross-sectional view of a patterned layer of material having a top surface with a plurality of projections and recesses. FIGS. 10B, 10C, and 10D illustrate cross-sectional views of a patterned layer of material having a selected topography formed in an integral manner with another layer of material.

FIG. 20A illustrates an example of closed non-volatile switch. FIG. 20B illustrates an open position of the non-volatile switch of FIG. 20A.

FIGS. 21A, 21B, and 21C illustrate an example energy harvesting system.

FIG. 21D illustrates another example energy harvesting system where a container is exposed though an opening in a packaging structure.

DETAILED DESCRIPTION OF CERTAIN EMBODIMENTS

Figure 2A:
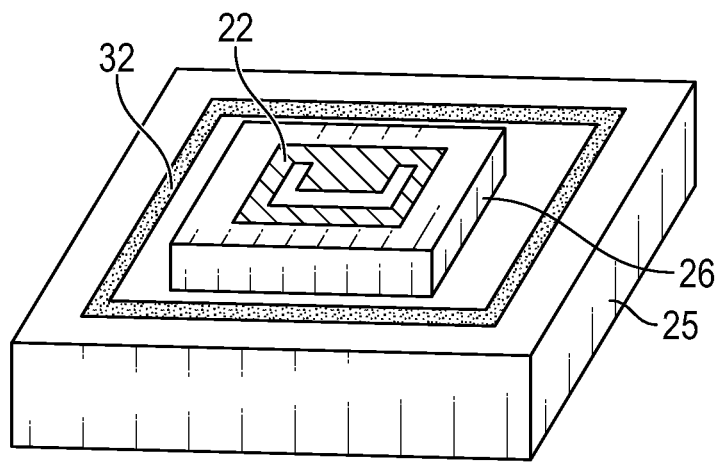
FIGS. 2A, 2B, and 2C illustrate example systems with magnetic structures and magnetically sensitive materials according to embodiments.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Aspects of this disclosure relate to structures that can modify and/or generate and/or respond to a magnetic field. Magnetically sensitive particles can be included in a container that retains the particles. A magnetic structure that modifies and/or generates a magnetic field can be integrated with the container. The magnetic structure can reset the position of the magnetically sensitive particles so the magnetically sensitive particles can start from a known position or reference point in certain applications. The magnetic structure can amplify an applied magnetic field to provide a stronger field to move magnetically sensitive particles in certain applications. The magnetic structure can be within the container or outside the container. The container can comprise an enclosure or channel. Example applications include without limitation magnetic field detection, zero-power detection, forming a conductive channel, a non-volatile switch, and energy harvesting.

Magnetic structures disclosed herein can amplify, direct or otherwise modify an external magnetic field to influence movement and/or position of magnetically sensitive particles. Such magnetic structures can enable external magnetic field properties (e.g., intensity, direction, etc.) to translate through to the magnetically sensitive particles and be measured and/or monitored. Some such example magnetic structures are flux concentrators.

Magnetic structures can be positioned on a cap. The cap can be used to enclose the magnetically sensitive particles or can be positioned over a container that includes magnetically sensitive particles. The cap can be exposed to an external environment in certain applications. Such a cap can be incorporated with a packaged component. A magnetic structure on a cap can be incorporated within a system that can include magnetic sensing structures in one or more locations that interact with external magnetic bodies or fields. This can enable measurement and/or monitoring of an indication of a magnetic field, such as direction of a magnetic field, position of a magnetic body, magnetic field density, magnetic field intensity, etc. Example locations of magnetic sensing structures can include, but are not limited to, on a plane beneath the cap, side by side with the magnetic structure on the cap, in one or more layers beneath an integrated circuit supporting the cap, or the like. A magnetic structure on the cap can interact directly, indirectly, or through a flux concentrating medium with one or more external magnetic bodies.

Magnetically sensitive particles within a container can be within a fluid or gel or flexible material. The fluid can include material properties that can enhance detection of position and/or movement of the magnetically sensitive particles. For example, a fluid can have a specific viscosity to tune responsiveness and/or sensitivity to a magnetic stimulus.

Magnetically sensitive particles can have one or more properties to enhance detecting an indication of a magnetic field. For example, magnetically sensitive particles can include one or more of a size, shape, or construction to enhance movement and/or detection.

Magnetically sensitive particles can include a functional coating in certain applications. For example, certain magnetically sensitive particles may stick together. Magnetically sensitive particles disclosed herein can include a coating that can reduce or eliminate magnetically sensitive particles sticking together. Such a coating can enhance bouncing or more effective resetting and/or re-configuration of particle positions. A coating could also affect luminescence and/or some or more other properties that can enhance optical detection. Functional coatings can cause the magnetically sensitive particles to not chemically react, not stick to each other or another structure, chemically react with a surface, have an electrically sensitive or reactive function that can make a cluster of magnetically sensitive particles easier to detect or react with structures within the container in a specific way, the like, or any suitable combination thereof. The functional coating can be selected depending on the specifications of a particular application to enhance detectability and hence the sensitivity of the system.

A container that retains the particles can have a variety of useful features and/or functionality. In some instances, a container can facilitate optical detection of magnetically sensitive particles. A container can include connections between internal surfaces of the container and the outside/other side or surface in some applications. In certain applications, a magnetic structure deposited on or incorporated within the construction of a container, where the magnetic structure can interact with an external magnetic body. The container can facilitate measurements associated with movement of magnetically sensitive particles therein as a proxy for monitoring an external body and/or magnetic field. The container can be incorporated into a packaged component and/or a module and/or a system in a package (SIP) where a magnetic structure is exposed and/or selectively exposed to an external environment. A shape of the container can impact responsiveness of a system that includes the container. For instance, a shape of the container can contribute to physically resetting the system and/or effective magnetically sensitive particle movement toward one or more sensor structures and/or enhance the detection of a cluster of particles within a specific region or area.

A SIP or another packaged module can include a container with features disclosed herein. Such a packaged module can include one or more of one or more stacked integrated circuits, one or more other stacked structures, one or more interconnected layers, one or more chiplets, one or more connections to the external environment via apertures, lenses, filters, membranes, or the like. A packaged module can have wireless communication capabilities in certain applications and include one or more antennas. In some applications, wireless communications from such a packaged module can be encrypted.

Embodiments disclosed herein can achieve advantages over other methods of magnetic field detection, generation, and/or modification. For example, there can be advantages related to the manufacturing process. A container with particles can be manufactured separately from the electronics, such as a measurement circuit, in a non-semiconductor process. As another example, parts of systems disclosed herein can be configured for magnetic field detection in environments that are not typically suitable for semiconductor components. Enclosing particles in container of certain materials (for example, glass or ceramic) can enable at least part of the system to be exposed to a harsher environment (e.g., with high temperature, corrosive, excessive humidity, heavy industrial, environment with harmful contaminants, etc.) than standard packaged semiconductor circuitry.

Magnetic structures disclosed herein can modify (e.g., concentrate, amplify, etc.) an external magnetic field to facilitate measurements related to the external magnetic field. Integrating such a structure with a container with magnetically sensitive particles can enable magnetic field measurements and/or improve accuracy of such magnetic field measurements. Alternatively or additionally, magnetic structures disclosed herein can generate magnetic fields to cause magnetically sensitive particles to move within a container for a variety of applications. For example, conductive channels, non-volatile switches, energy harvesting, and other useful functionality can be implemented.

Accuracy of magnetic field measurements in embodiments disclosed herein can be enhanced by using magnetically sensitive particles and/or structures disclosed herein. Magnetically sensitive particle shape and/or size can be selected to improve sensitivity of the system, which can be sensitivity to a particular position or direction of the magnetic field. This can also apply to the shape, size, and/or location of the magnetic sensing structures incorporated within the system. For example, a patterned sensing structure with one or more of a defined shape, topography, pattern, or composite structure can be located within the system to detect position and/or movement of magnetic particles in a specific location or direction. Such magnetic sensing structures can implement one or more of the following types of sensors: anisotropic magnetoresistive (AMR), magnetometric resistivity (MMR), giant magnetoresistance (GMR), tunnel magnetoresistance (TMR), inductive sensing, fluxgate, or the like. A fluid viscosity together with one or more magnetically sensitive particle properties can determine sensitivity and/or speed of a response to a magnetic field stimulus. The system can incorporate phase change materials for temperature monitoring in certain applications.

Embodiments described in this application can be integrated with and/or partially exposed to the surrounding environment. For example, magnetic structures and/or containers disclosed herein can be exposed to an external environment through an aperture or through a partially exposed area (e.g., as part of a SIP construction). Such an external environment can be harsh or hostile. Supporting sensitive circuitry and systems can be protected from the surrounding environment. The size of the aperture and/or shape and/or pattern can be constructed to detect a specific type of magnetic stimuli, such as one or more of a varying magnetic field, a direction of a magnetic field, a magnetic field associated with body of specific size or shape or movement, or the like.

Embodiments in this application can also be modified to enhance and/or optimize the sensitivity to external magnetic stimuli depending on the application. This can involve, for example, changing fluid or gel properties, particle size and/or shape, shape and/or thickness and/or pattern of magnetic sensitive material, or any suitable combination thereof.

Magnetic Structure Interacting with External Magnetic Field

Embodiments disclosed herein relate to magnetically sensitive particles in a container. Positions of the magnetically sensitive particles can change in response to an applied magnetic field. The applied magnetic field can be an external magnetic field. A magnetic structure integrated with the container can magnetically interact with both an external magnetic field and the magnetically sensitive particles.

For example, the magnetic structure can modify the external magnetic field. Such a modification can involve one or more of concentrating, amplifying, or directing the magnetic field. The magnetically sensitive particles can move in response to the modified magnetic field. Then the magnetically sensitive particles can be detected. A signal indicative of the magnetic field can be generated and output based on detecting the magnetically sensitive particles. The signal indicative of the magnetic field can be indicative of one or more of time of exposure to and intensity of a magnetic field, a direction of a magnetic field, an angle of a magnetic field, an intensity of a magnetic field, a rotation of a magnetic field, a profile of magnetically sensitive particles, a position of a magnetic body that generates the external magnetic field, a time domain change in a magnetic field (e.g., frequency and/or harmonics), or the like.

As another example, a magnetic structure integrated with the container can provide a bias to retain magnetically sensitive particles in position until (a) a magnetic field sufficient to move the magnetically sensitive particles is applied and/or (b) the magnetic structure is deactivated to stop providing the bias.

As one more example, a magnetic structure can generate a magnetic field to cause the magnetically sensitive particles to move in a particular way. For example, a magnetic field can be applied to cause magnetically sensitive particles to move such that the magnetically sensitive particles form a conductive channel. This can enable a "reset" function within the system.

FIGS. 1A, 1B, and 1C are schematic side or cross-sectional views of a sensing system 10 that includes magnetically sensitive particles 14 according to an embodiment. FIG. 1A illustrates magnetically sensitive particles 14 included in a medium 16. The magnetically sensitive particles 14 are located within a container 18. A magnetic structure 22 is integrated with the container 18. A sensing structure 24 is also integrated with the container 18. The sensing structure 24 can be located over a substrate or integrated circuit die 25. The container 18 can include a cap 26. In some other applications, a cap can be positioned over a container. One or more electrical connections 28 can electrically connect the magnetic structure 22 with one or more other circuit elements. In certain applications, the one or more electrical connections 28 include a through silicon via (TSV). There are a variety of different ways of incorporating conductive paths between layers other than TSVs. For example, one or more of wire bonds, solder bumps, conductive paste, anisotropic film or paste, or other technologies can be used as electrical connections for the magnetic structure 22 as suitable depending on the application.

The magnetic structure 22 can interact with an external magnetic field. The magnetic structure 22 can interact with the magnetically sensitive particles 14. As one example, the magnetic structure 22 can function as a flux concentrator. The magnetic structure 22 can be located on a surface of the container 18. For example, the magnetic structure 22 can be on a surface of the cap 26 as illustrated in FIG. 1A. In some other applications, the magnetic structure 22 can be included in a layer of the container 18 or positioned such that one or more other structures are located between the magnetic structure 22 and a surface of the container 18 at any suitable position. The cap 28 can be a cap substrate or another suitable structure (or construction capable of containing fluid and particles). The magnetic structure 22 can be implemented in accordance with any suitable principles and advantages of the magnetic structures disclosed herein.

The magnetically sensitive particles 14 can be paramagnetic, ferromagnetic, or diamagnetic. The medium 16 can be a gel or fluid. The medium 16 can be a film or flexible material in some other applications. The magnetically sensitive particles 14 can be diamagnetic and be repelled from the applied magnetic field. Examples of diamagnetic materials include graphite, gold, bismuth, antimony, quartz, and silver. The magnetically sensitive particles 14 can be paramagnetic. Paramagnetic materials include metals that are weakly attracted to magnets. Examples of paramagnetic materials include lithium, aluminium, tungsten, platinum, and manganese salts. The magnetically sensitive particles 14 can be ferromagnetic. Such magnetically sensitive particles 14 can include one or more suitable ferromagnetic material, such as iron, nickel, or cobalt. The magnetically sensitive particles 14 can be electrically conductive in certain applications. The magnetically sensitive particles 14 can be implemented in accordance with any suitable principles and advantages disclosed in one or more of U.S. patent application Ser. No. 17/933,600, filed Sep. 20, 2022; U.S. patent application Ser. No. 18/299,627, filed Apr. 12, 2023; U.S. patent application Ser. No. 18/170,765, filed Feb. 17, 2023; U.S. patent application Ser. No. 18/323,798, filed May 25, 2023; or U.S. patent application Ser. No. 18/053,523, filed Nov. 8, 2022; the technical disclosures of each of which are herein incorporated by reference in their entireties and for all purposes.

The magnetically sensitive particles 14 can include any suitable combination of features of the magnetically sensitive particles disclosed herein. The magnetically sensitive particles 14 can include one or more of the following materials: iron, cobalt, nickel, graphite, chromium, or any suitable alloy thereof. The magnetically sensitive particles 14 can include one or more of the following materials: Heusler alloys or chromium oxide. In certain applications, magnetically sensitive particles 14 can include polystyrene (PS) magnetic particles. Polystyrene magnetic particles can be synthesized by embedding superparamagnetic iron oxide into polystyrene. Polystyrene magnetic particles can be positively charged (e.g., by amine modification), unmodified, or negatively changed (e.g., by carboxyl modification). In some applications, the magnetically sensitive particles 14 can include streptavidin coated magnetic particles.

In certain applications, the medium 16 can be a liquid or a gel having a viscosity suitable to facilitate movement of the magnetically sensitive particles 14 therein such that the movement or location of the magnetically particles 14 can be used to detect a magnetic field. Such a fluid can have a suitable density and viscosity selected for a particular application. Example fluids for the medium material 16 include without limitation aqueous solutions (e.g., buffers, aqueous electrolytes, aqueous solutions with conductive salts, aqueous solutions without conductive salts, pH buffers, salts in water, etc.), organic solutions (e.g., oils or organic solvents), aqueous or organic gels (e.g., a hydrogel, polyvinyl chloride (PVC), polyacrylic acid, a polyvinyl-alcohol gel, a polydimethylsiloxane gel, agarose-PBS, a PVC gel in organic solvents such as 2-nitrophenyl octyl ether, etc.), water, an alcohol, an oil, or a fluid that allows Brownian motion of magnetically sensitive particles within the fluid. The fluid/gel/material properties can be chosen to deliver a desired particle movement (and thus sensitivity or response) depending to the specific application. In certain applications, the medium material 16 can change viscosity and/or phase with temperature. Such a medium material 16 can be any suitable fluid disclosed in U.S. patent application Ser. No. 18/053,523.

In certain applications, the medium 16 can be a film, a sheet of material, a flexible layer, or the like. For example, such a medium 16 can be a film with the magnetically sensitive materials embedded therein, a magnetic film layer incorporated in a flexible laminate structure, a sheet of material or a flexible layer with magnetic material deposited or adhered thereon. The medium 16 can be a flexible substrate. Suitable materials for a film medium 16 can include polymer materials such as SU-8, polyimide, polyvinyl alcohol, polyacrylic acid, polyvinylalcohol, polydimethylsiloxane, poly(3,4-ethylenedioxythiophene), Nafion, polyaniline, or the like. Some such polymer materials are conductive. In some instances, the medium 16 can include a plastic such as polyethylene terephthalate (PET), polyethylene naphthalate (PEN), polyimide, or a transparent plastic. According to some applications, the medium 16 can include a ferroelectric thin film. The medium 16 can include thin glass. The medium 16 can include a metal foil. The medium 16 can have metal traces formed thereon and/or particles attached/embedded. The medium 16 can alternatively or additionally include metallic non-magnetic material such as Au, Cu, or Al. The medium 16 can include magnetic materials such as NiFe, Ni, NiFeCo, CoZrTa, CoFe, or the like. The medium 16 can include gold in certain instances. In some instances, the medium 16 can be a mesh rather than a continuous layer.

The medium 16 can be implemented in accordance with any suitable principles and advantages disclosed in one or more of U.S. patent application Ser. No. 17/933,600, filed Sep. 20, 2022; U.S. patent application Ser. No. 18/299,627, filed Apr. 12, 2023; U.S. patent application Ser. No. 18/170,765, filed Feb. 17, 2023; U.S. patent application Ser. No. 18/323,798, filed May 25, 2023; or U.S. patent application Ser. No. 18/053,523, filed Nov. 8, 2022; the technical disclosures of each of which are herein incorporated by reference in their entireties and for all purposes.

As illustrated, the container 18 includes a cap 26. In FIG. 1A, a through substrate via (TSV) is illustrated as an example of an electrical connection 28 that can extend through the cap 26. The TSV can be a through silicon via extending through a silicon substrate. Any other suitable electrical connection 28 can alternatively or additionally be implemented. Examples of other electric connections include without limitation a wire bond, conductive paste, a sputtered or plated conductive trace, a anisotropic conductive material, etc. The electrical connection 28 can electrically connect the magnetic structure 22 and/or other circuit elements on the cap 26 to an element on one or more layers below the cap 26. For example, the electrical connection 28 can provide an electrical connection to the substrate or integrated circuit die 25. In certain applications, a control circuit on the substrate or integrated circuit die 25 can provide a bias signal and/or a control signal to the magnetic structure 22 by way of the electrical connection 28.

The container 18 can be implemented in accordance with any suitable principles and advantages of a container, an enclosure, a channel, and/or a compartment as disclosed in one or more of U.S. patent application Ser. No. 17/933,600, filed Sep. 20, 2022; U.S. patent application Ser. No. 18/299,627, filed Apr. 12, 2023; U.S. patent application Ser. No. 18/170,765, filed Feb. 17, 2023; U.S. patent application Ser. No. 18/323,798, filed May 25, 2023; or U.S. patent application Ser. No. 18/053,523, filed Nov. 8, 2022; the technical disclosures of each of which are herein incorporated by reference in their entireties and for all purposes.

The sensing structure 24 can be located at any suitable position (depending on the specifications of a particular application) to detect the magnetically sensitive particles 14. The sensing structure 24 can be any suitable sensing structure, such as, but not limited to, a magnetic sensor, an inductive sensor, a capacitive sensor, or an optical sensor. The sensing structure 24 can be in communication with (e.g., electrically connected to) the substrate or integrated circuit die 25.

The sensing structure 24 can include any suitable sensor disclosed herein. Sensing magnetically sensitive material can be implemented by, without limitation, magnetic sensors, case conductance measurements, zero-power direction detection measurements, microelectromechanical systems based sensing, optical sensors, resistance based sensing, capacitive sensing, the like, or any suitable combination thereof. Example measurement systems and methods disclosed in U.S. patent application Ser. No. 17/933,600, filed Sep. 20, 2022, the technical disclosure of which is herein incorporated by reference in its entirety and for all purposes. The sensing structure 24 can include a magnetic sensor array. Such a magnetic sensor array can include magnetoresistive sensors, fluxgate sensors, or the like. The sensing structure 24 can include inductive sensors in certain applications. An inductive sensor can include a coil having an inductance that changes based on a distance of the magnetically sensitive particles 14 from the coil. For an inductive sensor, the magnetically sensitive particles can be conductive and ferromagnetic for the inductive sensor to achieve relatively high sensitivity.

In some applications, the sensing structure 24 can detect a profile associated with the magnetically sensitive particles 14. The container construction can include flexible components such that at least a portion of the container can be deformed mechanically. Example profile detection is disclosed in the context of force detection in U.S. patent application Ser. No. 18/364,255 filed Aug. 2, 2023, the technical disclosure of which is herein incorporated by reference in its entirety and for all purposes. Any suitable principles and advantages of such profile detection can be implemented in accordance with any suitable principles and advantages disclosed herein (e.g., where a magnetic stimulus causes particles to move and then the profile of the magnetically sensitive particles is detected).

The substrate or integrated circuit die 25 can include control circuitry to control and/or bias the magnetic structure 22. The substrate or integrated circuit die 25 can include control circuitry to control and/or bias the sensing structure 24. The substrate or integrated circuit die 25 can include a measurement circuit and/or processing circuitry to process an output and/or generate a measurement from the sensing structure 24. The measurement from such circuitry can be indicative of a magnetic field.

Referring to FIG. 1B, a magnetic field can be applied to the sensing system 10. An external body 29 can apply such a magnetic field. While an external body 29 is illustrated, any other suitable magnetic field can be detected in accordance with any suitable principles and advantages disclosed herein. The magnetic field from the external body 29 interacts magnetically with the magnetic structure 22. The magnetic structure 22 can function as a flux concentrator and cause the magnetically sensitive particles 14 to move and/or cluster in a certain way.

In FIG. 1C, the external body 29 is positioned closer to the magnetic structure 22 than in FIG. 1B. The magnetic structure 22 can amplify the magnetic field generated by the external body 29. The magnetically sensitive particles 14 can move within the container 18. For example, as illustrated in FIG. 1C, the magnetically sensitive particles 14 are positioned closer to the sensing structure 24 than shown in FIG. 1B. The sensing structure 24 can detect the position and/or movement of the magnetically sensitive particles 14. A measurement circuit of the substrate or integrated circuit die 25 can generate and output a measurement of the magnetic field associated with the external body 29.

In some applications, the magnetic structure 22 can provide a magnetic bias to hold the magnetically sensitive particles 14 in position until a magnetic field sufficient to move the magnetically sensitive particles 14 is applied and/or until the magnetic structure 22 is deactivated.

In some applications, the magnetic structure 22 can cause the magnetically sensitive particles 14 to move in a particular way. For example, the magnetic structure 22 can cause the magnetically sensitive particles 14 to move to an initial position or move from a position in which they are stuck or held. As another example, the magnetic structure 22 can cause the magnetically sensitive particles 14 to form/disperse a conductive channel and/or close/open a switch.

Figure 2B:
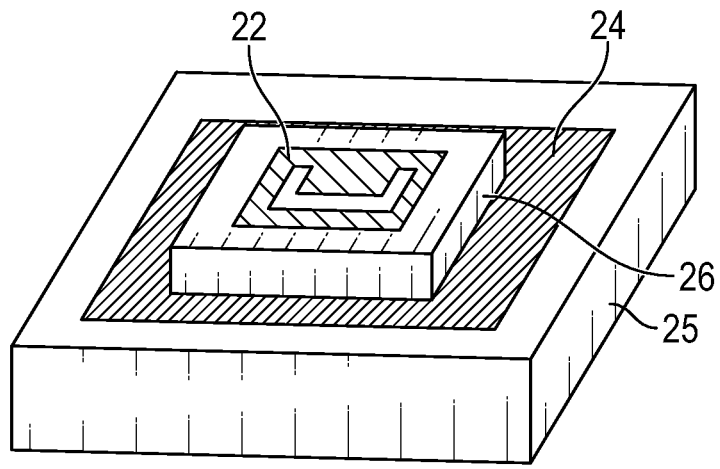
Figure 2C:
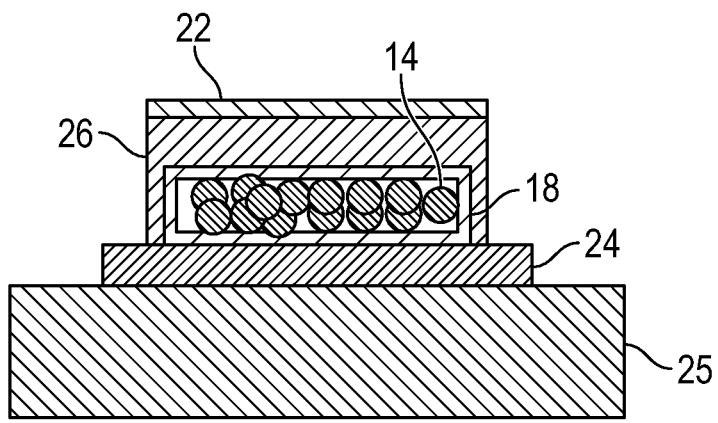

FIGS. 2A, 2B, and 2C illustrate example systems with magnetic structures and magnetically sensitive materials according to embodiments. The magnetic structures and materials used can have one or more of different patterns, shapes, topographies, composite structures, etc. depending on the specifications of the application. FIGS. 2A and 2B are isometric views of example systems. FIG. 2C is a cross sectional view of an example system. In these embodiments, magnetic structures are arranged to modify and/or generate a magnetic field. A magnetic structure on a cap can interact with an external magnetic stimulus and magnetically sensitive particles within a container. Any suitable principles and advantages of FIGS. 2A, 2B, and 2C can be implemented together with each other. The cap can include, but is not limited to, silicon, glass, laminate, ceramic, or another suitable material.

A system can include more than one magnetic structure. The magnetic structures and materials used can have one or more of different patterns, shapes, topographies, composite structures, etc. depending on the specifications of the application. For example, as shown in FIG. 2A, a first magnetic structure 22 can be on a cap 26 and a second magnetic structure 32 can be on the substrate or integrated circuit die 25. The cap 26 can be integrated with a container or form part of a container. The substrate or integrated circuit die 25 can be an application specific integrated circuit (ASIC) die or a substrate that incorporates a semiconductor. The magnetic structures 22 and 32 are located on different planes. In certain applications, the magnetic structures 22 and 32 can interact with an external magnetic field in a coordinated way. As one example, the magnetic structures 22 and 32 can channel and/or concentrate magnetic flux in some applications.

A system can include an integrated sensing layer. The sensing layer can be a magnetic sensing layer. FIG. 2B illustrates an example system with a sensing structure 24. The sensing structure 24 is positioned vertically relative to the cap 26 and a layer containing magnetically sensitive particles. The sensing structure 24 can be below the cap 26. The sensing structure 24 can be below and/or on a layer below a layer containing magnetically sensitive particles.

FIG. 2C is a cross sectional view of the example system of FIG. 2B. In this example system, a magnetic structure 22 is on a cap 26 and the magnetic structure magnetically interacts with an external magnetic field and magnetically sensitive particles 14. The sensing structure 24 can detect the magnetically sensitive particles that are within the container 18. As illustrated in FIG. 2C, the container 18 is encapsulated by the cap 26 and the sensing structure 24. In various embodiments, the container 18 can be encapsulated by a cap 26 and a sensing structure 24 and/or another element, such as a substrate or integrated circuit die 25. The container 18 can enable a conductance measurement. The container 18 can include one or more integrated structures, such as, but not limited to, one or more conductive traces, one or more sensing elements, one or more insulating layers, or any suitable combination thereof. The one or more integrated structures can be included for the specifications of a particular application. The one or more integrated structures can enable functionality of a system and/or an interaction between particles within the container 18 and the sensing structure 24 and/or processing circuitry. Processing circuitry of the substrate or integrated circuit die 25 can generate a measurement indicative of the external magnetic field based on an output from the sensing structure 24.

Sensing systems disclosed herein can be implemented in a system in a package (SIP), a packaged module, or other suitable packaged components. A magnetic structure can be exposed through an opening in a packaging structure. In certain applications, an opening in the packaging structure can leave at least a portion of the magnetic structure exposed to an external environment. The packaging structure can include a molding material, a sealed cavity/hermetic structure or "can," or any other suitable structure to protect integrated circuits.

Figure 3:
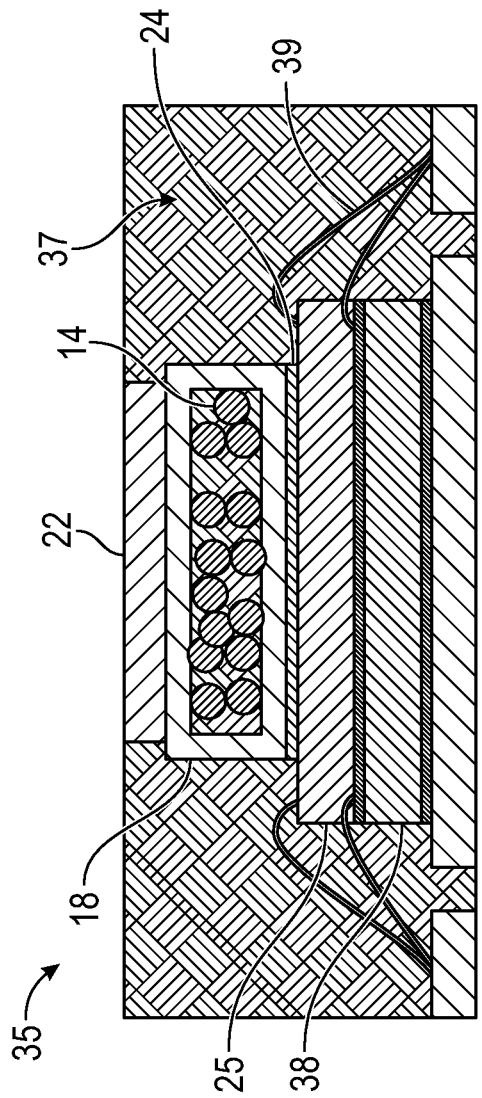
FIG. 3 illustrates a cross sectional view of an example system in a package according to an embodiment.

FIG. 3 illustrates a cross sectional view of an example SIP 35. A magnetic field from an external body can interact a magnetic structure 22 of the SIP 35. As shown in FIG. 3, the magnetic structure 22 can be exposed to an external environment. The magnetic structure 22 can be positioned over a container 18. A packaging structure 37 of the SIP 35 can include an opening through which the magnetic structure 22 is exposed to the external environment. The magnetic structure 22 can function as a flux concentrator. In response to an external magnetic field, magnetically sensitive particles 14 in the container 18 of the SIP 35 can move or cluster in a certain way (e.g., direction). A sensing structure 24 can detect the position and/or movement/intensity of the magnetic field as a result of the external magnetic field. Processing circuitry of the substrate or integrated circuit die 25 can generate a measurement indicative of the external magnetic field based on an output of the sensing structure 24. One or more other layers of circuit elements 38 can be vertically integrated with the substrate or integrated circuit die 25. The resulting electrical output from the processing circuitry can provide an indication of one or more of the direction, intensity, proximity, concentration, etc. of a magnetic field.

A container can be incorporated in a variety of ways within a SIP, module, or other packaged module, or other packaged component. For example, the container can be vertically integrated or stacked with one or more other components. As another example, the container can be positioned side by side with one or more other components (e.g., integrated circuits, passives, discrete circuit elements, chiplets, etc.). Components of a SIP, module, or other packaged component can be electrically connected in a variety of different ways, such as by one or more TSVs, one or more conductive tracks, one or more wire bonds, conductive paste, anisotropic conductive material, the like, or any suitable combination thereof. The electrical connections can be selected for specifications of a particular application. etc. depending on the specifications of a particular application. As one example, wire bonds 39 are shown in FIG. 3. As another example, the electrical connections 28 shown in FIGS. 1A-1C are TSVs.

Containers and Integrated Structures

A container can include one or more integrated structures, such one or more magnetic structures, one or more sensors, one or more biasing structures, optical vias, apertures, one or more antennas, or the like. A sensor can detect magnetically sensitive material within a container. For example, one or more sensors can detect position and/or movement of magnetically sensitive particles within the container. The one or more sensors can include a magnetic sensor. A magnetic structure can concentrate or amplify an external magnetic field and influence the movement or position of particles or magnetically sensitive structures within the container. In some applications, a magnetic structure can generate a magnetic field to cause magnetically sensitive particles to move within the container. A biasing structure can be arranged to reset positions of magnetically sensitive particles within a container in a detectable manner. Example structures that can be integrated with a container will now be discussed. Phase change materials can be included within the system structures to enable temperature monitoring. Any suitable principles and advantages of these integrated structures can be implemented together with each other.

Figure 4A:
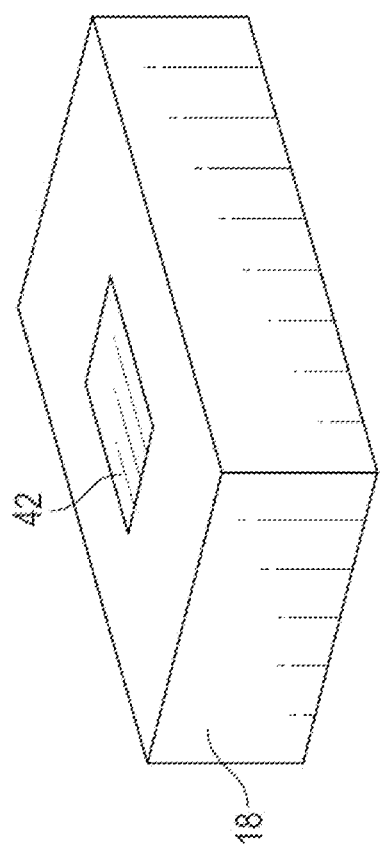
FIG. 4A is a schematic isometric view of an example container with an integrated structure according to an embodiment.

FIG. 4A is a schematic isometric view of an example container 18 with an integrated structure 42 according to an embodiment. The integrated structure 42 can implement the magnetic structure 22 of any of FIGS. 1A to 3 in certain applications. The integrated structure 42 can include magnetically sensitive material deposited on a substrate (e.g., a cap substrate) or container, for example. The container 18 can be a structure containing magnetically sensitive particles in a medium, such as a fluid. The integrated structure 42 can be a sensor configured to detect magnetically sensitive particles within the container, such as a magnetoresistive sensor or a fluxgate sensor. The integrated structure 42 can be located on a surface of the container. The integrated structure 42 can be included on and/or within one or more layers of the container 18. The integrated structure 42 can be located in any suitable position of the container 18, such as on a top and/or a bottom of the container 18. The integrated structure 42 can be on a different side of the container 18 than a side at which a magnetic field is applied. The integrated structure 42 can be on a side of the container 18 at which a magnetic field is applied.

Figure 4B:
FIG. 4B illustrates example magnetic material patterns for the integrated structure on the container of FIG. 4A that is a magnetic structure according to embodiments.

In some instances, the integrated structure 42 can be a magnetic structure. The integrated structure 42 can be a magnetic structure on the container 18. Such a magnetic can be a block of magnetic material, layers of magnetic material, a pattern of magnetic material, or a composite structure incorporating magnetic material. The shape and/or structure of such a magnetic structure can be selected for a particular application. This can enable detection/sensitivity to a specific direction of particle movement and/or cluster, shape, direction, intensity etc. The magnetic structure can concentrate, amplify, or generate a magnetic field. FIG. 4B illustrates example magnetic material patterns for the integrated structure 42 on the container of FIG. 4A that is a magnetic structure.

Conductive structures can also be deposited on and/or integrated with a container that includes magnetically sensitive particles in a fluid. Such conductive structures can provide signal transmission, manipulate and/or interact with the magnetically sensitive particles, or the like. In certain applications, the movement of the particles within the container can act as a proxy for a property of the external magnetic field.

Figure 4C:
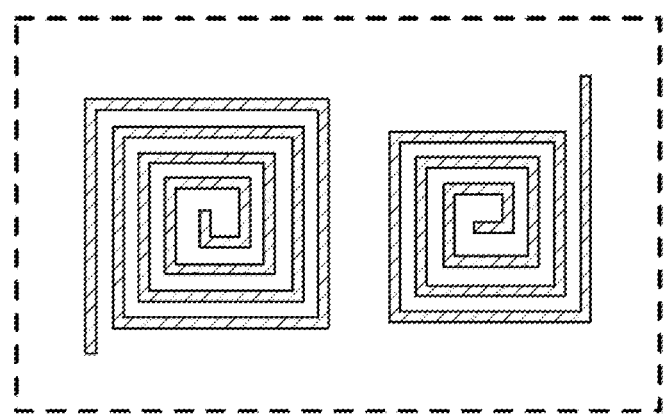
FIG. 4C illustrates examples of coils for antennas that can be implemented on the container of FIG. 4A according to embodiments.

FIG. 4C illustrates examples of coils for antennas that can be implemented on the container 18 of FIG. 4A. Such antennas can wirelessly transmit signals associated with a magnetic field (e.g., presence of a magnetic body, magnitude of magnetic field, direction or proximity of magnetic field, density or intensity of magnetic field, etc.). In certain applications, an antenna can be included in a radio frequency identification (RFID) tag. Wireless communication circuitry that supports wireless signal transmission can encrypt any suitable information for wireless signal transmission. The wireless communication circuitry can be implemented by an integrated circuit (or semiconductor integrated within the system), such as the substrate or integrated circuit die 25 of any of the systems disclosed herein. Such systems can also include one or more antennas, such as the antennas of FIG. 4C. An antenna can wirelessly transmit encrypted data. As shown in FIG. 4C, a pair of antennas can be implemented. The antennas of FIG. 4C can be on the container 18 of FIG. 4A, for example.

Figure 4D:
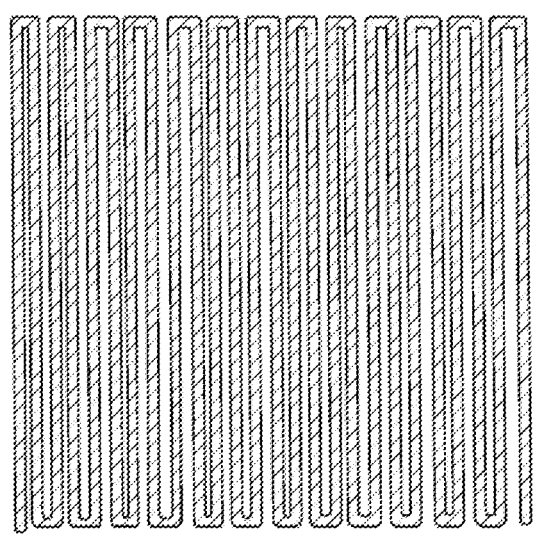
FIG. 4D illustrates an example meander shaped structure that can be implemented on the container of FIG. 4A according to an embodiment.

FIG. 4D illustrates an example meander shaped structure that can be implemented on the container 18 of FIG. 4A. The integrated structure 42 of FIG. 4A can have the meander shape shown in FIG. 4D. The meander shaped structure can generate a gradient magnetic field. In certain applications, a gradient magnetic field generated by a meander shaped structure can attract or affect a magnetically sensitive particle better than a magnetic field generated by a coil. Being able to move particles can enable a reset of the magnetically sensitive particles. Such particle movement can be achieved in a number of ways, such as using an electromagnet. Moving the particles can alternatively or additional change a state of a conductive channel and/or non-volatile switch.

Figure 4E:
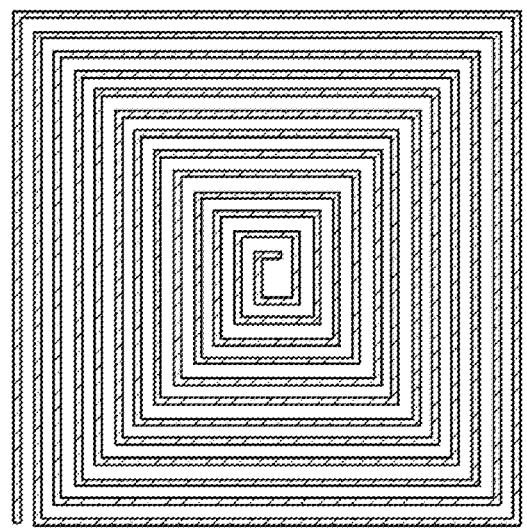
FIG. 4E illustrates an example coil structure that can be implemented on the container of FIG. 4A according to an embodiment.

FIG. 4E illustrates an example coil shaped structure that can be implemented on the container 18 of FIG. 4A. The integrated structure 42 of FIG. 4A can have the coil shown in FIG. 4E. The coil shaped structure can generate a magnetic field in certain applications.

Figure 5:
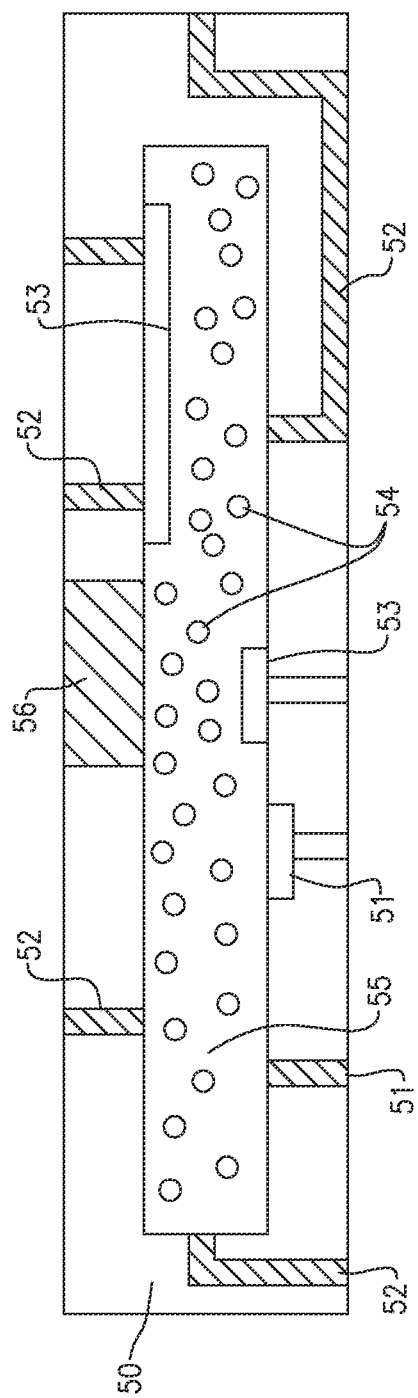
FIG. 5 is a schematic cross-sectional view of an example enclosure having a plurality of integrated structures according to an embodiment.

A container can include one or more integrated structures that can combine to enable specific functionality and sensitivity of the system being constructed depending on the specifications of a particular application. FIG. 5 illustrates an example enclosure 50 having a plurality of integrated structures according to an embodiment. One of more of these structures can be integrated with any of the containers or enclosures disclosed herein as suitable.

As illustrated, the enclosure 50 includes conductive structures 51 and 52. The illustrated conductive structures 51 include vias and a conductive trace through or on packaging dielectric materials (e.g., printed circuit board (PCB) layers, encapsulating molding materials, ceramic, glass, composite, metallic, laminate, polymer, etc.). The enclosure 50 can include one or more structures 53 on a surface thereof and/or embedded within the layers of the enclosure 50. For example, a sensor, a conductive trace, or a coil can be included on an inner surface (as shown) or outer surface of the enclosure 50. The enclosure 50 can include electrically conductive paths 52 from an internal part of the enclosure 50 to external to the enclosure 50, which can be provided in the form of traces, vias and/or lead frame materials.

The enclosure 50 also includes particles 54 within a material 55. The particles 54 can be one or more of conductive, magnetically sensitive, paramagnetic, diamagnetic, ferromagnetic, or ferrimagnetic materials. The material 55 can be a fluid, a liquid, a gel, a paste, a foam, or a polymer that permits relative movement of the particles in response to magnetic fields. The material 55 can be electroactive.

The enclosure 50 can include an optical window 56 such that a cluster or movement of particles can be optically detected. The optical window 56 can be incorporated into the container. One or more of particle size, shape, or color can be such that a cluster of particles can be optically detected though the optical window 56. The particles 54 can be detected with a naked eye or with a suitable optical sensor integrated within the system.

FIG. 6A illustrates example compressed magnetic bodies and/or particles within a container according to embodiments. These magnetic bodies and/or particles can generate magnetic flux. The magnetic bodies and/or particles can be included within a container and/or embedded within a material inside the container. The shape/size/profile can be modified to enhance and/or optimize sensitivity and/or detection of clusters/movement, etc. by the sensing structures incorporated within the system.

Examples of the integrated structure 42 of FIG. 4A are provided in FIG. 6B, where the integrated structure is a magnetic sensor. The magnetic sensor can detect a change and/or position of magnetically sensitive particles in a container and/or a medium. The magnetic sensor can be included on a surface of a container, within a laminate substrate, within a stack of a system, or the like.

FIG. 6B illustrates example magnetic sensors included within systems that can detect magnetically sensitive particles according to embodiments. Such magnetic sensors can include patterned magnetoresistive (xMR) or fluxgate structures. These magnetic sensors can enable relatively high sensitivity magnetic particle detection. Such detection can involve detecting one or more of proximity, movement, direction, cluster shape, or the like. One or more of shapes, sizes, profiles, or constructions of the sensing structures can be selected to improve sensitivity and/or detection of one or more of particle clusters, direction of movement, or the like depending on the specifications of the application.

The magnetically sensitive particle properties and magnetic sensor properties can be selected for achieving a desired detection sensitivity for a particular application. The magnetically sensitive particle properties can include one or more of size, shape, composition, or the like. The magnetic sensor properties can include one or more of pattern, thickness, or material. The magnetic sensor can be an xMR sensor, a fluxgate sensor, or some other suitable sensing structure, for example.

Sensing structures can use other sensing techniques, such as an inductive sensing technique. A coil having an inductance that changes based on a distance from a conductive material can be used for magnetic field detection. For a material that is conductive and ferromagnetic, relatively high sensitivity detection can be achieved.

Profiles of Magnetic Structures

A magnetic structure integrated with a container can have a variety of different profiles and/or topographies. A variety of different surface finishes, micro etches, surface roughening, other treatments, or any suitable combination thereof can be applied to magnetic structures. Magnetic structures integrated with a container can be implemented in accordance with any suitable principles and advantages disclosed herein. Depending on the application, adhesion characteristics of the surface can be selected to enhance and/or optimize adhesion or interaction of certain particle sizes and/or shapes.

FIGS. 7A, 7B, 7C, 7D, and 7E illustrate example side profiles of magnetic structures. The magnetic structure can be a patterned layer of magnetic material. Such a patterned layer of magnetic material can have a selected height characteristic perpendicular to a plane in which the perimeter, boundary or shape of the layer is defined. The selected height characteristic can provide specific magnetic properties of the magnetic structure, such as the ability to produce or respond to magnetic fields along specific spatial directions or orientations. These topographies can improve adhesion or interaction with particles of a certain shape or size.

FIGS. 8A, 8B, and 8C illustrate cross-sectional side views of embodiments of patterned layers having selected height characteristics perpendicular to a plane in which the perimeter, boundary or shape of the layer is defined. The illustrated cross-sections may represent a slice of the patterned layer taken along an axis parallel to the plane in which the perimeter, boundary or shape of the layer is defined.

FIG. 8A illustrates an embodiment of the patterned layer having a substantially constant height 81 in the direction perpendicular to the plane defining the shape of the layer along an axis 82 parallel to the plane defining the shape. A substantially constant height may provide substantially constant magnetic properties of the patterned layer along the axis.

FIGS. 8B and 8C illustrate embodiments of the patterned layer having a height in the direction perpendicular to the plane defining the shape of the layer that vary along axes parallel to the plane defining the shape. In FIG. 8B, the patterned layer has a height varying from substantially zero to a predetermined height 83. In FIG. 8C, the patterned layer has a height varying from a first predetermined height 86 to a second predetermined height 87 different than the first predetermined height. The height of the patterned layer also may vary according to a selected function of the distance along the axes 85, 89. In FIGS. 8B and 8C, the height may vary as a linear function of the distance along the axes 85, 89. In some other embodiments, the height may vary according to other functions of the distance along the axis 85, 89, such as non-linear functions, stepped functions, etc. A varying height may provide correspondingly varying magnetic properties of the patterned layer along the axis. For example, embodiments of a varying height may be used to produce or respond to magnetic fields along the axis to provide position detection or current sensing of an object along the axis. A specific side profile many enhance and/or optimize sensitivity in an application depending on the particle size, shape, fluid properties, etc.

The patterned layer of material may be formed in an integral manner with one or more other layers to form a composite layer. FIGS. 9A and 9B illustrate perspective and cross-sectional side views, respectively, of an embodiment of a patterned layer of material formed in an integral manner with another layer of material. The patterned layer of material may include a plurality of separate portions 84 embedded in the other material 88 so that the other material 88 occupies spaces between the separate portions 84 of the magnetic layer. The patterned layer of material can include a first set of surfaces 92 exposed at a first surface or boundary of the composite layer, and a second set of surfaces 96 covered by the other material 88 within the composite layer. The other layer of material 88 may be a material having a selected magnetic property or another type of material.

The composite layer may provide specific magnetic, electric, or structural properties. In embodiments in which the second material 88 is also a material having a selected magnetic property, the second material 88 may alter, such as increase, decrease, or otherwise set, the magnetic properties of the patterned layer of material 84 to provide specific magnetic properties of the composite layer. In embodiments in which the second material 88 is another type of material, the second material 88 can alter the magnetic properties of the patterned layer of material 84 to provide specific magnetic properties of the composite layer and/or can provide structural or electrical properties to the composite layer.

The embedded portions of the patterned layer can also have a selected cross-sectional area. In FIGS. 9A and 9B, the embedded portions may have a rounded or semi-circular cross-sectional area. In some other embodiments, the embedded portions may have other cross-sectional areas, such as one or more of square, rectangular, or trapezoidal cross-sectional areas, etc.

The cross-sectional area of the embedded portion also may have a selected constancy along axes. In FIGS. 9A and 9B, the embedded portions can have a substantially constant cross-sectional area along a longitudinal axis 94 to which the portions are aligned. FIG. 9C illustrates a cross-sectional top view of another embodiment of a composite layer in which the embedded portions have a cross-sectional area having a width 95 that changes along a longitudinal axis 97 in a predetermined manner, such as in a linear manner. FIG. 9D illustrates a cross-sectional side view of another embodiment of a composite layer in which the embedded portions may have a cross-sectional area having a height 99 that changes along a longitudinal axis 101 in a predetermined manner, such as in a linear manner.

The layer of material having the selected magnetic property may include a surface with a selected topography. The selected topography may provide specific magnetic, electric, or structural properties to the layer. FIG. 10A illustrates a cross-sectional view of a patterned layer of material 102 having a top surface 100 with a plurality of projections 104 and recesses 108. The plurality of projections 104 may be formed in an array having a characteristic periodic spacing between them, as may be the plurality of recesses 108. The projections 104 and recesses 108 may be interleaved with each other. The layer of material with the selected topography can be formed in an integral manner with one or more additional layers to form a composite layer, as discussed above. FIGS. 10B to 10D illustrate cross-sectional views of a patterned layer of material having a selected topography formed in an integral manner with another layer of material. In FIG. 10B, the projections 104 of the patterned layer 102 include portions 116 exposed above a top surface 120 of the second layer of material 118. In FIG. 10C, the projections 104 of the patterned layer 102 and the top surface 128 of the second layer of material 124 are located at substantially the same level. In FIG. 10D, the second layer of material 132 completely encloses the projections 104 of the patterned layer.

Figure 11D:
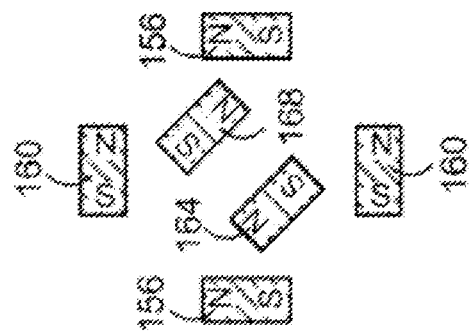
FIGS. 11A, 11B, 11C, and 11D illustrate top views of embodiments of patterned layers including a plurality of separate portions with aligned magnetic polarities.
Figure 11C:
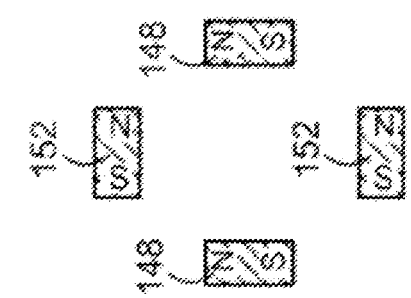
Figure 11B:
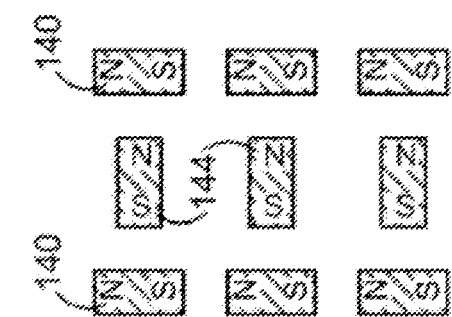
Figure 11A:
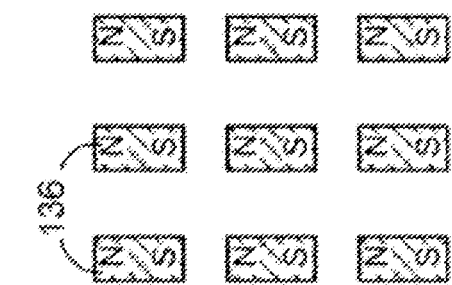

The layer of material having the selected magnetic property may include a plurality of separate portions having magnetic polarities aligned according to a selected configuration to provide specific magnetic properties. FIGS. 11A to 11D illustrate top views of embodiments of patterned layers including a plurality of separate portions with aligned magnetic polarities. FIG. 11A illustrates an embodiment of a patterned layer including a plurality of separate portions 136 arranged in a two-dimensional array, each of the separate portions 136 having magnetic pole axis aligned in a same direction. FIGS. 11B and 11C illustrate embodiments of a patterned layer including a first plurality of separate portions 140, 148 arranged in an array, each having magnetic pole axis aligned in a same first direction, and a second plurality of separate portions 144, 152 also arranged in an array, each having magnetic pole axis aligned in a same second direction, the first and second directions being perpendicular to each other. FIG. 11D illustrates an embodiment of a patterned layer including first and second pluralities of separate portions 156, 160 having magnetic pole axes respectively aligned in first and second perpendicular directions, and third and fourth separate portions 164, 168 having magnetic pole axes respectively aligned in third and fourth perpendicular directions.

Flux Concentrators

In some embodiments, a magnetic flux concentrator to selectively channel and/or concentrate magnetic flux can be integrated with a container. A magnetic flux concentrator can include one or more patterned layers having a plurality of separate portions with different distributions of material having selected magnetic properties to selectively channel and/or concentrate magnetic flux. With a magnetic flux concentrator, magnetic flux from an external magnetic field can be channelled and/or concentrated to magnetically sensitive particles within a container. This can assist with generating a measurement associated with the external magnetic field.

Figure 12A:
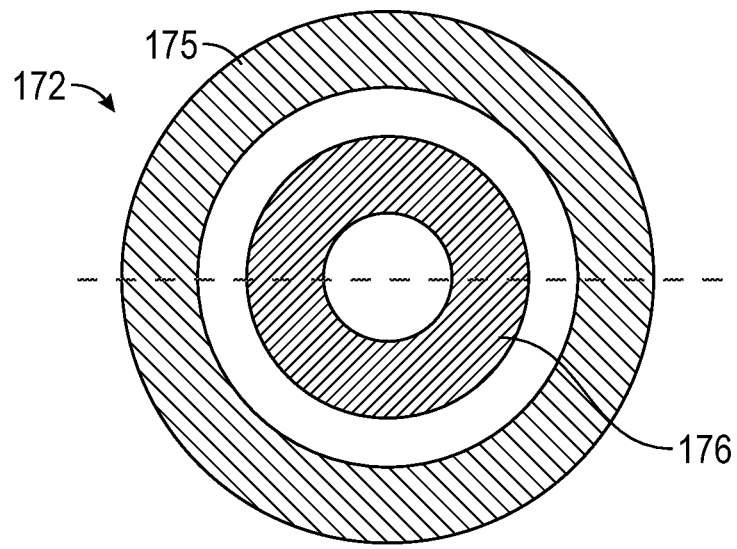
FIG. 12A illustrates a top view of a magnetic flux concentrator according to an embodiment.
Figure 12B:
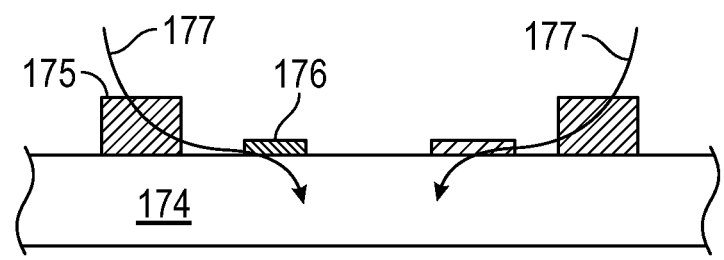
FIG. 12B illustrates a cross-sectional side view of the magnetic flux concentrator along the dashed line in FIG. 12A.

FIG. 12A illustrates a top view of a magnetic flux concentrator according to an embodiment. FIG. 12B illustrates a cross-sectional side view of the magnetic flux concentrator along the axis in FIG. 12A. As illustrated, a magnetic flux concentrator 172 is on a substrate 174. The magnetic flux concentrator 172 can include a plurality of patterned magnetic layers having one or more of different distributions of material having selected magnetic properties along a selected dimension and/or different flux surface areas. A first patterned layer 175 can include an outer concentric ring and a second patterned layer 176 can include an inner concentric ring. The outer concentric ring may be formed on the substrate 174 to a first height, and the inner concentric ring may be formed on the substrate 174 to a second height less than the first height. Accordingly, the outer concentric ring may have a different material distribution in the vertical direction and different flux surface areas than the inner concentric ring. The material of the patterned layers of the magnetic flux concentrator may be a material having a relatively high permeability to magnetic fields, such as permeability above a predetermined threshold.

In operation, the magnetic flux concentrator 172 of FIGS. 12A and 12B can channel and/or concentrate the magnetic flux of a magnetic field in an environment in a predetermined manner so that the magnetic flux is directed toward magnetically sensitive particles within a container. FIG. 12B shows an example path of magnetic flux 177. Above and below the illustrated device, the magnetic flux may be oriented in substantially the vertical direction. As the magnetic flux passes through the magnetic flux concentrator 172, the magnetic flux may be directed along the depicted path as a result of the relative arrangement of the patterned layers 175, 176, which may provide a preferential path for magnetic flux as a function of their magnetic properties. This may result in the magnetic flux bending to take a substantially or at least more horizontal path. Channelling and/or concentrating the magnetic flux along a selected direction may provide a number of advantages, including one or more of enabling the magnetically sensitive particles to have an operational sensitivity to magnetic fields along the horizontal direction instead of the vertical direction, enabling configurations of a device that may sense both vertical and horizontal magnetic fields, increasing sensitivity to external magnetic field, or the like. The flux concentrator facilitates the channeling of an external magnetic stimulus to a specific area or region containing magnetically sensitive particles and/or sensing structures so that efficient detection is enabled. With such detection, an inference of the properties of the external magnetic field can be generated.

A magnetic flux concentrator can include magnetic structures having patterned layers of any suitable shape. A magnetic flux concentrator can include magnetic structures having patterned layers including varying heights. The flux concentrator structure can be modified/optimized depending on the specifications of a particular application.

Figure 13A:
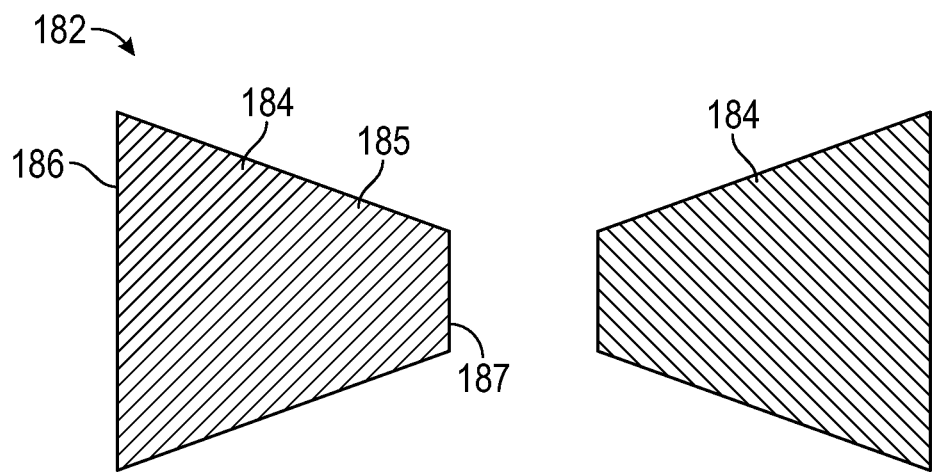
FIGS. 13A and 13B illustrate top and side cross-sectional views of an embodiment of a magnetic flux concentrator.
Figure 13B:
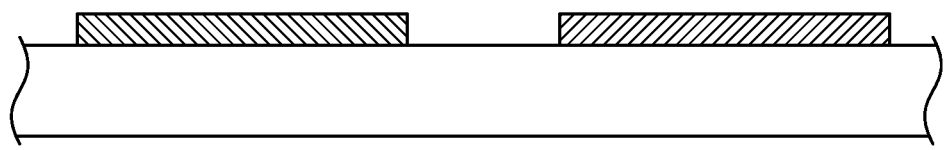

Another embodiment of a magnetic flux concentrator to selectively channel and/or concentrate magnetic flux along different paths will be discussed with reference to FIGS. 13A and 13B. FIGS. 13A and 13B illustrate top and side cross-sectional views of an embodiment of a magnetic flux concentrator 182. The magnetic flux concentrator 182 can include a patterned layer of magnetic material 184 on a substrate. The patterned layer 184 can include one or more separate segments to concentrate and/or channel magnetic flux. The magnetic flux can be directed to magnetically sensitive particles and/or specific locations within a container in accordance with any suitable principles and advantages disclosed herein. Magnetic material of the magnetic flux concentrator 182 can have a relatively high permeability to magnetic fields, such as a permeability above a predetermined threshold, and material of the magnetic sensor may be a magnetoresistive material.

The patterned layer 184 can have a decreasing surface area for the magnetic flux travel to channel and/or concentrate flux in a particular direction. For example, the patterned layer 184 can include a segment 185 to channel and/or concentrating magnetic flux from a first flux concentration at a flux entry area 186 to a second flux concentration larger than the first flux concentration at a flux exit area 187 smaller than the flux entry area.

In some other embodiments, further configurations of magnetic flux concentrators can be implemented. Magnetic flux concentrators can channel and/or concentrate magnetic flux as the magnetic flux travels in various different selected directions, such as in one or more of between different concentrations in a single direction, such as a vertical direction, a horizontal direction, or another direction; or as the magnetic flux changes direction from first direction to a second direction, such as a change in direction from a horizontal to vertical direction, from a vertical to a horizontal direction, or from any first predetermined direction to any second different predetermined direction. The flux concentrator structure can be modified/optimized depending on the specifications of a particular application.

Particles

Magnetically sensitive particles can have one or more properties for implementing particle movement and/or detection within a system. For example, magnetically sensitive particles can be constructed, shaped, patterned, or the like so the magnetically sensitive particles respond to a magnetic stimulus and/or can be detected in a desired way. As one example, a spiral shaped magnetic particle can respond to a magnetic stimulus and move in the medium (e.g., a fluid or gel or some other suitable flexible material capable of holding particles) differently than a spherical or square shaped particle. The viscosity of the medium and the shape of the magnetically sensitive particle can be balanced for movement of the magnetic particle in response to a magnetic stimulus. In certain applications, the magnetically sensitive particles can be coated with an electrically conductive material (e.g., gold) such that when a certain amount of particles cluster or align, a conductive path is formed between electrical contacts in a container. In some applications, the magnetically sensitive particles can be coated with a coating to enhance optical detection, such as a coating to achieve one or more of a desired optical contrast, color, fluorescence, luminescence, or another optical property. The particle can be constructed with a functional coating that can attract, repel, interact with, reduce friction, be chemically active, etc., such that the efficient detection of a cluster of particles is enhanced and/or optimized. In certain instances, magnetically sensitive particles can be coated so as to not chemically react with a surface or other structure.

The shape of magnetically sensitive particles can affect how the magnetically sensitive particles move and cluster in certain applications. Depending on the outermost material, magnetically sensitive particles may stick together. In some applications, the magnetically sensitive particles can be coated with a thin material, such as Teflon or another polymer, so that there is little or no potential for the magnetically sensitive particles to stick together and/or cluster for any reason other than a response to a magnetic field. The container can incorporate one or more conductive vias and connections from the internal surfaces to the external. The container can incorporate one or more optical conduits and/or areas that facilitate optical detection of particle clusters or movement.

Magnetically sensitive particles can be constructed to move and/or respond in different ways. Sensitivity, such as movement, to certain magnitudes of a magnetic field can be improved with certain particle constructions, shapes, etc. The magnetically sensitive particles can be combined with and/or embedded within non-magnetic material to provide the effect of a partially patterned structure. The combined structure can then be inserted within a fluid, a gel, a flexible material, or a film.

In some instances, magnetically sensitive particles can include an outer coating that is magnetically sensitive. As an example, magnetically sensitive particles can be a polystyrene bead coated with nickel and/or another magnetically sensitive material. Such magnetically sensitive particles can have an overall density of magnetic material that is lower than a homogenous sphere of magnetically sensitive material. In some other examples, magnetically sensitive particles can have magnetically sensitive core materials and coatings selected to enhance or inhibit interaction with each other and/or the surrounding fluid. For example, the outer coating could be polystyrene, PTFE, Teflon, or some other polymer that can inhibit particles sticking together other than in a desired way as a response to stimulus from a magnetic field.

In certain instances, magnetically sensitive particles have an electrically conductive outer surface. For example, magnetically sensitive particles can be coated with gold. With such magnetically sensitive particles, an electric contact between two electrodes in a container can be closed.

Magnetically sensitive particles can have a coating with one or more specific optical properties in some applications. With such a coating, one or more of a contrast, a color, luminescence or fluorescence can be achieved. The coating with one or more specific optical properties can aid optical detection of magnetically sensitive particles.

Magnetically sensitive particles can be ferromagnetic, ferrimagnetic, paramagnetic, or diamagnetic. Diamagnetic particles are repelled by a magnetic field. In contrast, paramagnetic and ferromagnetic particles are attracted by a magnetic field.

The magnetically sensitive particles can have any suitable size for a particular application. The magnetically sensitive particles can be sized such that individual magnetically sensitive particles have a diameter larger than individual openings of a container. In certain applications, magnetically sensitive particles are micrometer scale or larger. In some applications, magnetically sensitive particles are millimeter-scale particles. Magnetically sensitive particles can be larger than millimeter-scale. In certain applications, magnetically sensitive particles can have a particle width in a range from about 50 nanometers to 1 millimeter. In some such applications, particle width can be in a range from about 0.1 micron to 100 microns. In some of these applications, particle width can be in a range from about 0.5 micron to 100 microns.

Magnetically sensitive particles can have a shape to influence their movement and/or orientation in the fluid such that their sensitivity to an applied force is enhanced and/or optimized. In certain applications, it may be desirable to have a non-symmetrical magnetically sensitive particle so that the magnetically sensitive particle moves in a particular way when exposed to a magnetic field. A particular particle shape combined with a fluid or gel of a particular viscosity can provide a desired sensitivity to a magnetic stimulus. Different particle sizes and shapes can be combined as desired for a range of target sensitivities within a system. The particles can also be constructed to have a shape that, for example, facilitates clustering or physical joining together of groups of particles.

Figures 14A, 14B:
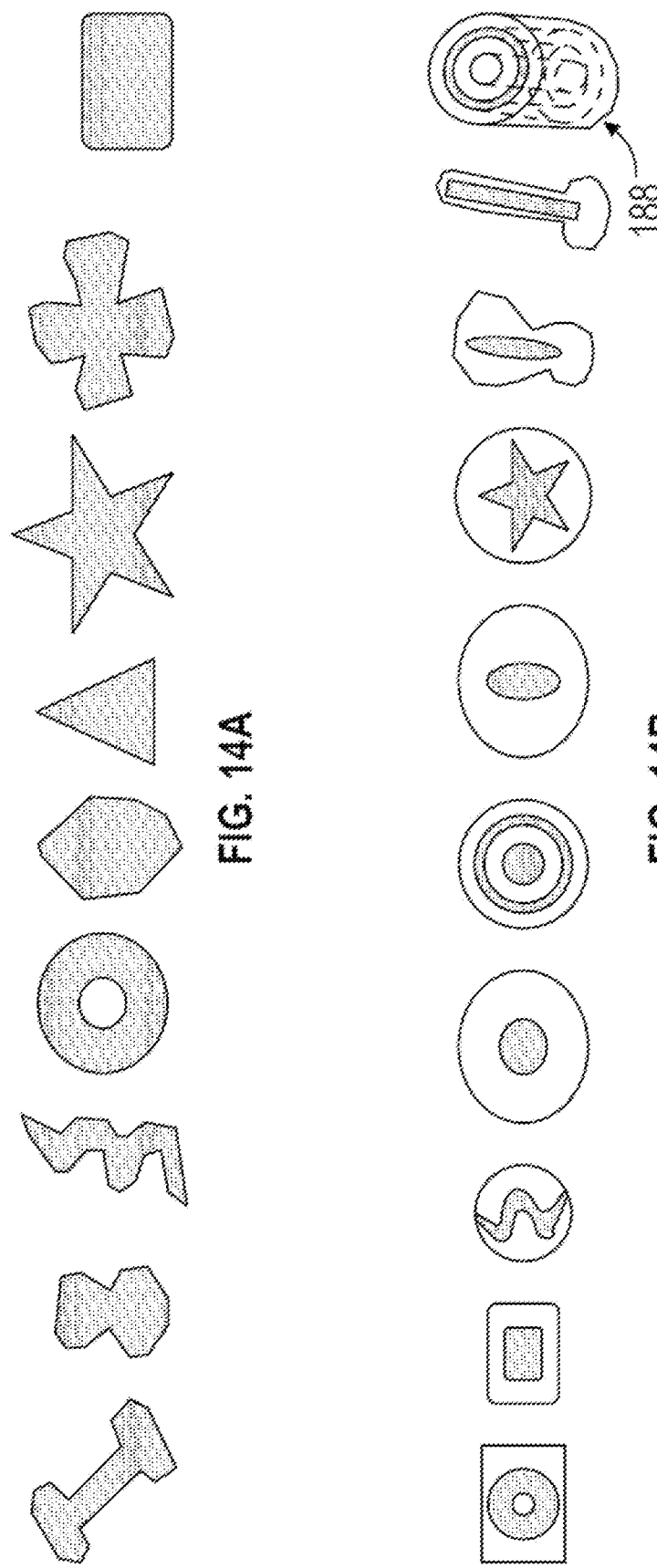
FIG. 14A illustrates example shapes of magnetically sensitive particles.
FIG. 14B illustrates example combined structures with magnetically sensitive particles included within non-magnetic material.

FIG. 14A illustrates example shapes of magnetically sensitive particles. The magnetically sensitive particles can be added to an inert, non-magnetic material to form a combined structure. FIG. 14B illustrates example combined structures with magnetically sensitive particles included within non-magnetic material. The particle construction (e.g., one or more of shape, size, construction, composite, constituent matter, layers, etc.) can be modified and optimized depending on the specifications of a particular application. Various processes, such as molding, printing, laser cutting, laminating, sputtering, plating, and the like, can be used to fabricate composite particles incorporating magnetically sensitive particles so that the magnetically sensitive particles react in a desired manner to a magnetic field. For example, with an outer non-magnetic layer, when a number of the composite particles come together, they may be held in a cluster by a magnetic field/force. Such composite particles can have non-magnetic material come into physical contact with one or more other composite particles. Such a construction can be desirable to allow release of such composite particles from one another in the absence of the magnetic field. For example, spherical particles with magnetic cores and covered with polystyrene/PTFE may be less likely to stick together and may bounce off each other. A combination of particle shape (e.g., spiral shape, propeller shape, etc.) and fluid viscosity can determine sensitivity and/or speed of a response to a magnetic field stimulus. One or more of the particle shape, construction and size can be modified and/or optimized depending on the specifications of a particular application.

Magnetically sensitive particles can have various sizes and densities. If all particles are the same size, a contact surface area can be relatively small. By using a plurality of sizes (e.g., large and small), a bridging structure can have more contact points. This can allow smaller particles to reduce resistance and/or increase current carrying capability. Combining different types of magnetically sensitive particles can result in clustering with different shapes, which can be useful for detection purposes.

As shown in FIG. 14B, magnetically sensitive particles can include a functional coating. The functional coating can attract, repel, interact with, reduce friction, or the like. In some applications, a sleeve or cylinder 188 with an opening at the center can have a magnetically sensitive material embedded within a wall.

The magnetically sensitive particles can have coatings that can be chemically active or otherwise functional. Functional coatings can act through effecting specific chemical, photochemical, or biochemical properties. Magnetically sensitive particles can be functionalised with particular chemistries (e.g., amino groups or hydroxyl groups). For example, magnetically sensitive particles can be coated with a surfactant type material, PTFE to reduce friction between magnetically sensitive particles and enable relatively quick response times when exposed to a stimulus within a container. Anti-reflective or/or anti-corrosion or/or anti-microbial coatings can be applied depending on the specifications of a particular application. Such coatings can include, for example, Ag, Cu, organosilanes, r quaternary ammonium, or the like. Antimicrobial surfaces can be functionalized in a variety of different processes. A coating may be applied to a surface that has a chemical compound that is toxic to microorganisms. Alternatively, a surface can be functionalized adsorbing a polymer and/or polypeptide and/or by changing its micro and/or nanostructure.

Coatings to attract or repel certain elements can be applied. The specific coating applied may depend on the specifications of a particular system. Technologies such as nanoparticle deposition could be used to attach nanoparticles to solid surfaces of the magnetic/conductive particles creating coatings that could be constructed to react with the presence of specific elements.

A combination of different particle sizes, shapes, coatings, and/or one or more other properties can enhance magnetic field detection sensitivity.

A magnetically sensitive particle can have a magnetic material on a surface. Material on the surface of a magnetically sensitive particle can be a patterned magnetic material. The patterned magnetic material can be soft magnetic material. By defining poles on the particle surface, the magnetically sensitive particles can structure themselves differently. Different stacking arrangements and/or orientations of the magnetically sensitive particles in response to a magnetic stimulus can be achieved by different magnetic material patterns. The presence of an external magnetic field can disturb such a structure and allow for the creation and removal of bridging elements. The particles can have a sufficient size for patterning magnetic material on their surfaces. Particles can build chains in a magnetization direction. Out of plane magnetization for patterned magnetic material on particle surfaces can be desirable. A particle surface patterned with a magnetic material can affect how a particle moves or responds when exposed to a varying magnetic field or affect the detectability of a cluster of particles.

Although embodiments disclosed herein are described with reference to magnetically sensitive particles, any suitable principles and advantages disclosed herein can be implemented in association with other particles. Such other particles can be electrically conductive and not magnetically sensitive. Alternatively or additionally, such other particles can be included within a magnetically sensitive fluid and the other particles can move within the magnetically sensitive fluid in response to an applied magnetic field. One or more other stimuli (e.g., force) other than a magnetic stimulus can cause particles to move in accordance with any suitable principles and advantages disclosed herein.

Medium Material with Change in Viscosity and/or Phase

In some instances, the magnetically sensitive particles can be included in a medium material that can change viscosity and/or state in response to a change in temperature, for example, as described in U.S. patent application Ser. No. 18/053,523, filed Nov. 8, 2022, the disclosure of which is hereby incorporated by references in its entirety and for all purposes. Any suitable principles and advantages of magnetically sensitive particles in a medium material and/or a phase change material disclosed in U.S. patent application Ser. No. 18/053,523 can be implemented in accordance with any suitable principles and advantages disclosed herein.

Phase change materials can be used as a medium such that the particles within such phase change materials only move when temperature is above or within a threshold temperature. With such phase change materials, particle movement and/or magnetic field detection can be enabled and/or disabled at particular ambient temperatures. In some instances, a medium can include a material that changes viscosity with temperature so as to adjust mobility of particles within the medium. This can adjust sensitivity of magnetic field detection based on temperature.

Incorporating phase change material can enable increased sensitivity within a system. For example, a threshold temperature to start detecting a magnetic field or other stimulus and/or the temperature of the object in proximity to the structure can be detected. If the magnetically sensitive material does not move within phase change material until a specific temperature had been reached, an indication of ambient temperature and/or the temperature of a body (adjacent or pressing against the structure) can be monitored.

Container Shapes

Figure 15:
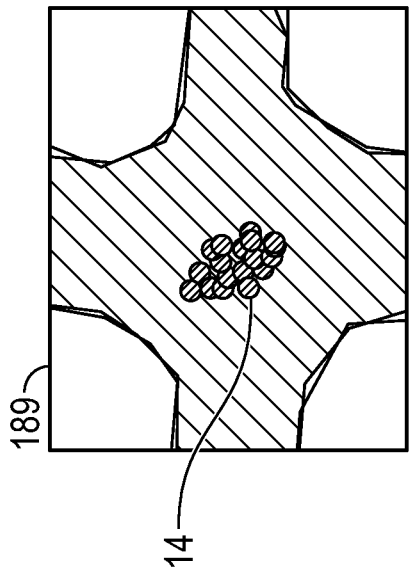
FIG. 15 is an example plan view of a container with magnetically sensitive particles.

Containers that retain magnetically sensitive particles can have a variety of different shapes, materials, and/or methods of fabrication to influence, direct, and/or constrain particle movement. FIG. 15 is an example plan view of a container 189 with magnetically sensitive particles 14. The container can be fabricated such that the particles can only move within defined areas or paths.

Figure 16C:
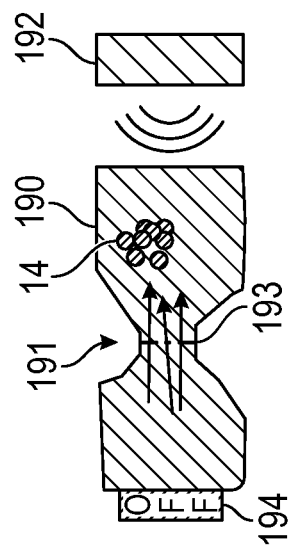
FIGS. 16A, 16B, and 16C illustrate a plan view of a container with a constricted region.
Figure 16B:
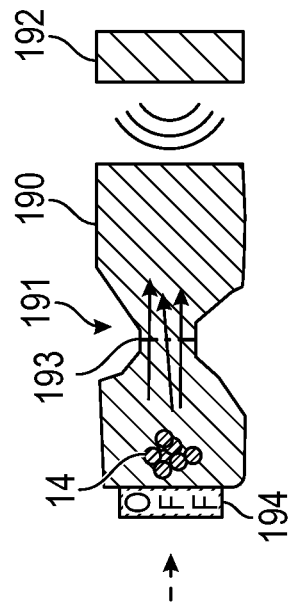
Figure 16A:
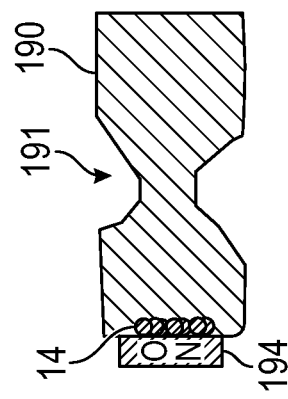

A container can be shaped for desired particle movement paths/speeds/distance in the presence of an applied magnetic field. For example, FIGS. 16A, 16B, and 16C illustrate a plan view of a container 190 with a constricted region 191. Over time and/or with a minimal threshold field, particles can flow through the constricted region 191 based on exposure to an applied magnetic field. For instance, in FIGS. 16B and 16C, magnetically sensitive particles 14 flow toward a magnetic field source 192 that has an associated magnetic field. A biasing structure 194 integrated with the container 190 can bring the magnetically sensitive particles 14 to an initial position. The illustrated biasing structure 194 is a magnetic structure integrated with the container 190 that magnetically interacts with the magnetically sensitive particles 14 within the container 190. The biasing structure 194 can also magnetically interact with an external magnetic field, such as a magnetic field applied by the magnetic field source 192. The biasing structure 194 can retain the magnetically sensitive particles 14 in the initial position in the absence of an external magnetic field overpowering the biasing structure 194 when the biasing structure 194 is activated. The inclusion of a biasing structure 194 can enable the positions of the particles to be reset. The construction of the biasing structure 194 can be implemented in different sizes and/or shapes and/or settings depending on the specifications of a particular application and quantity, size, shape and properties of the particles used.

The magnetically sensitive particles 14 are in the initial position in FIG. 16A. The biasing structure 194 can be deactivated to allow the magnetically sensitive particles 14 to flow in response to an applied magnetic field. The biasing structure 194 can also be used as a reset mechanism to bring the magnetically sensitive particles 14 to the initial position. The container 190 and magnetically sensitive particles 14 can be used to detect a cumulative magnetic field exposure based on an amount of magnetically sensitive particles 14 that move through the constricted region 191.

In some instances, a semipermeable membrane or filter 193 can be included in a narrow side of the container 190 so that the magnetically sensitive particles 14 find little resistance crossing towards one direction but not the opposite direction. That can allow magnetically sensitive particles 14 to move to one side and remain there even when the magnetic field is no longer present. If such a membrane or filter 193 is designed accordingly, the magnetically sensitive particles 14 can be impeded from moving back through the membrane or filter 193, or moved through the membrane by applying a strong magnetic or electric fields to reset the device. The membrane or filter 193 is an example of a resistance structure that can impede magnetically sensitive particles 14 from propagating in a particular direction. A resistance structure an include a membrane, a filter, or any other suitable structure to impede particle movement in a direction.

Figures 17A, 17B:
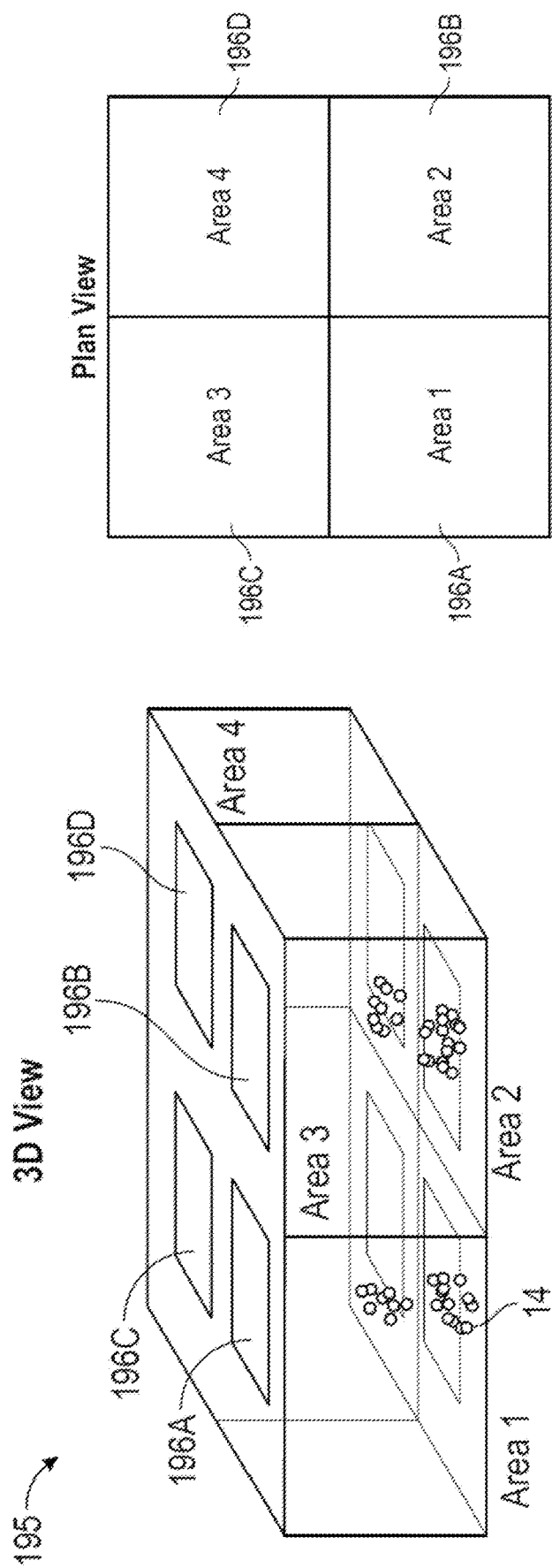
FIG. 17A is an isometric view of a system with a plurality of containers each including particles according to an embodiment.
FIG. 17B is a plan view of the system of FIG. 17A that illustrates areas of the containers.

FIG. 17A is an isometric view of a system 195 with a plurality of containers 196A, 196B, 196C, and 196D each including particles 14 according to an embodiment. FIG. 17B is a plan view of the system 195 of FIG. 17A that illustrates areas of the containers 196A, 196B, 196C, and 196D. The containers 196A, 196B, 196C, and 196D can be partitioned particle spaces. Each of the containers 196A to 196D can be an isolated space in which particles 14 are free to move. The particles 14 can be within one or more of a fluid, gel, or flexible material in each of the particle spaces. Movement of the particles 14 can be detected in one or more of the containers 196A to 196D. There can be an integrated magnetic structure corresponding to each container in accordance with any suitable principles and advantages disclosed herein. Alternatively or additionally, there can be an integrated magnetic structure that can magnetically interact with magnetically sensitive particles in two or more of the containers. In another embodiment, a container can be segregated internally into different regions with different patterned/deposited biasing or magnetic structures constructed such that each separate region has a different ability or strength to attract or hold magnetic particles.

The system 195 of FIGS. 17A and 17B can include a plurality of relatively small particle spaces in the form of the illustrated containers. Particles 14 in different particle spaces pf the system 195 can be isolated from each other. In certain applications, the system 195 can be integrated with a semiconductor die or system incorporating chiplets and/or micro components constructed in a space efficient manner. The system 195 can be vertically integrated with a circuit board and/or an ASIC and incorporated with one or more other electronic components. Measurements can be generated associated with one or more individual containers 196A to 196D. In certain applications, the system 195 can be used to validate operation and/or verify functionality. A measurement can be generated associated with each of the illustrated containers 196A to 196D. The measurement can indicate that part of a chip or system is functional. Alternatively, the measurement can indicate that part of a chip or system may be damaged or otherwise unreliable. In some instances, a comparative measurement can be implemented in accordance with any suitable principles and advantages disclosed in U.S. patent application Ser. No. 18/299,627, filed Apr. 12, 2023, the technical disclosures of each of which are herein incorporated by reference in their entireties and for all purposes. By comparing a plurality of measurements each associated with an individual container 196A to 196D, a comparative measurement can be generated that is indicative of whether certain parts of a chip or system may have issues. This can bin part(s) of a chip or system instead of binning an entire chip or system. The comparative measurement can indicate a location of a problem.

In the system 195, a first side of each container 196A to 196D can include an electrical contact. The electrical contact can cover the entire first side of a container in certain applications. A second side of the container can include one or more electrically controllable pads, where the second side is opposite to the first side. With multiple connections, better reliability can be achieved.

Example Applications

Systems with magnetically sensitive particles in a container with an integrated magnetic structure herein can be implemented in a variety of applications. Example applications related to zero-power detection, forming a conductive channel, a non-volatile switch, and energy harvesting will now be discussed.

In some applications, systems disclosed herein can perform zero-power detection of exposure to a high magnetic field or magnetic field interference. With zero-power detection, a device does not need power to be applied during exposure to the external field in order to detect the magnetic field. Rather, power can be applied at a later stage while interrogating the system to take a measurement of the state of the system (or an external optical detection system can be used to detect clusters/movement of particles), but the system can maintain its status from the prior exposure without power until the later interrogation. In zero-power detection embodiments, biasing magnets are magnetic structures that are integrated with a container that interact magnetically with magnetically sensitive particles in the container.

Figure 18A:
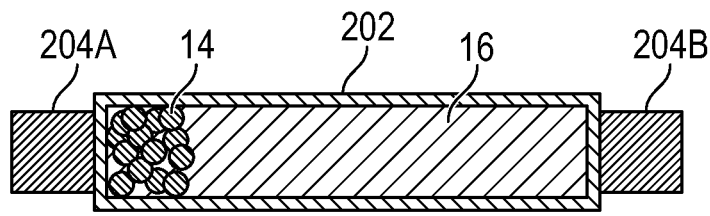
FIGS. 18A, 18B, 18C, 18D, 18E, and 18F illustrate enclosures with particles that can be used for zero-power detection according to an embodiment.

FIGS. 18A to 18F illustrate enclosures with particles that can be used for zero-power detection according to an embodiment. FIG. 18A illustrates an example enclosure 202 with biasing magnets 204A and 204B on opposing ends. The enclosure 202 is a sealed enclosure containing medium 16 and magnetically sensitive particles 14 in the medium 16. The enclosure 202 is pre-loaded with the magnetically sensitive particles 14 in an initial position as shown in FIG. 18A. In the illustrated initial position, the magnetically sensitive particles 14 are positioned at one end of the enclosure 202 by the biasing magnet 204A. The biasing magnet 204A can attract the magnetically sensitive particles to the initial position. If undisturbed, the magnetically sensitive particles 14 can stay in the initial position. Zero-power detection techniques can be applied to non-magnetically sensitive particles in magnetically sensitive fluids in certain applications.

Figure 18B:
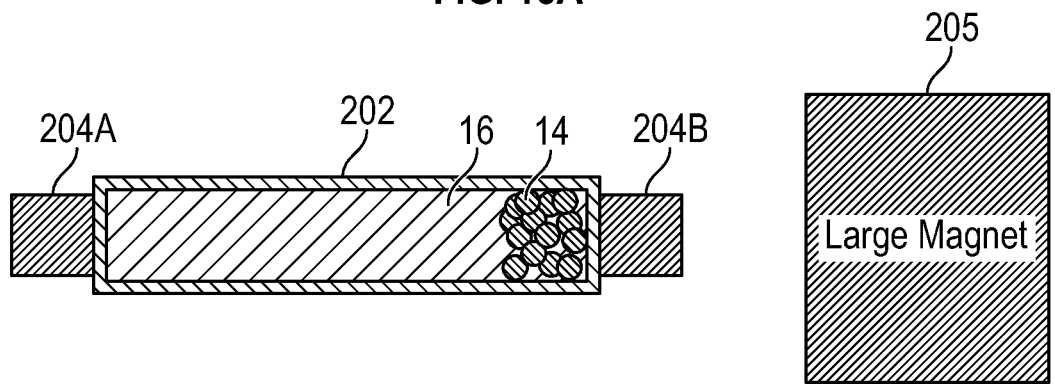

FIG. 18B illustrates the magnetically sensitive particles 14 after a large magnet 205 (representative of any source of external magnetic field) causes the magnetically sensitive particles 14 to move from one end of the enclosure 202 to an opposite end of the enclosure. The large magnet 205 applies a larger magnetic field than the biasing magnets 204A and 204B. The biasing magnet 204B can retain the magnetically sensitive particles 14 in the position shown in FIG. 18B until a sufficiently large magnetic field moves the magnetically sensitive particles 14. Accordingly, the magnetically sensitive particles 14 can remain in the position shown in FIG. 18B after the large magnet 205 no longer applies a strong magnetic field. Power need not be applied at the time of the exposure for measurement. Rather, power can be later applied for measurement, even in the absence of the field, because the system maintains the status from the exposure without power. The sensitivity of the system can be modified through changing one or more of the particle size, construction, fluid or gel, or flexible material properties as described herein.

A plurality of enclosures 202 can together be used to determine exposure to a magnetic field in a direction in space. For example, 4 enclosures 202 positioned relatively close to each other with a proper initial state of magnetically sensitive particles can record and store an indication of exposure to a relatively large magnetic field in a direction in an xy-plane. As another example, 6 enclosures 202 can be used to detect a magnetic field in the xyz-space.

Figure 18C:
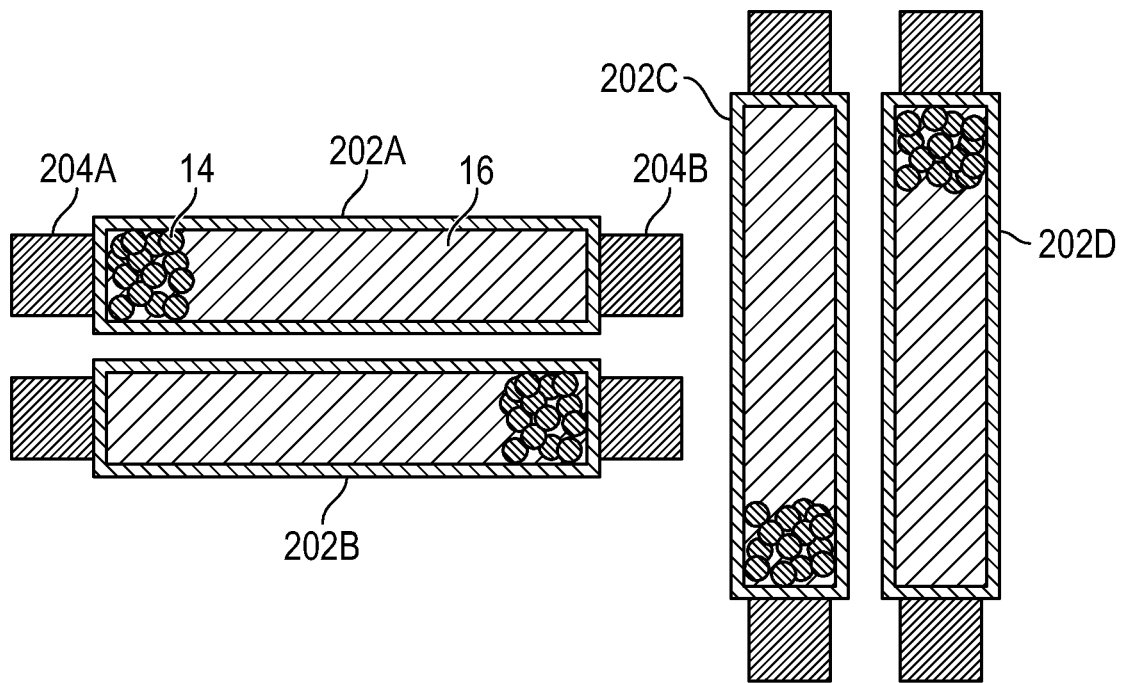

FIG. 18C illustrates 4 enclosures 202A, 202B, 202C, 204D each including magnetically sensitive particles 14 in medium 16 in an initial position according to an embodiment. The enclosures 202A, 202B, 202C, 204D can together be used to detect a magnetic field in a direction in an xy-plane. In the initial position, two enclosures are oriented along a direction with magnetically sensitive particles starting at opposing ends of the enclosures. Enclosures 202A and 202B are oriented along a first direction with magnetically sensitive particles 14 positioned at opposite ends. Enclosures 202C and 202D are oriented along a second direction with magnetically sensitive particles 14 positioned at opposite ends. As illustrated, the first and second directions are orthogonal. Each of the enclosures 202A, 202B, 202C, 204D can have integrated biasing magnets 204A and 204B and contain magnetically sensitive particles 14 and medium 16. Reference numbers of these elements are included for the enclosure 202A and omitted for the other enclosures in FIGS. 18C, 18D, 18E, and 18F.

Figure 18D:
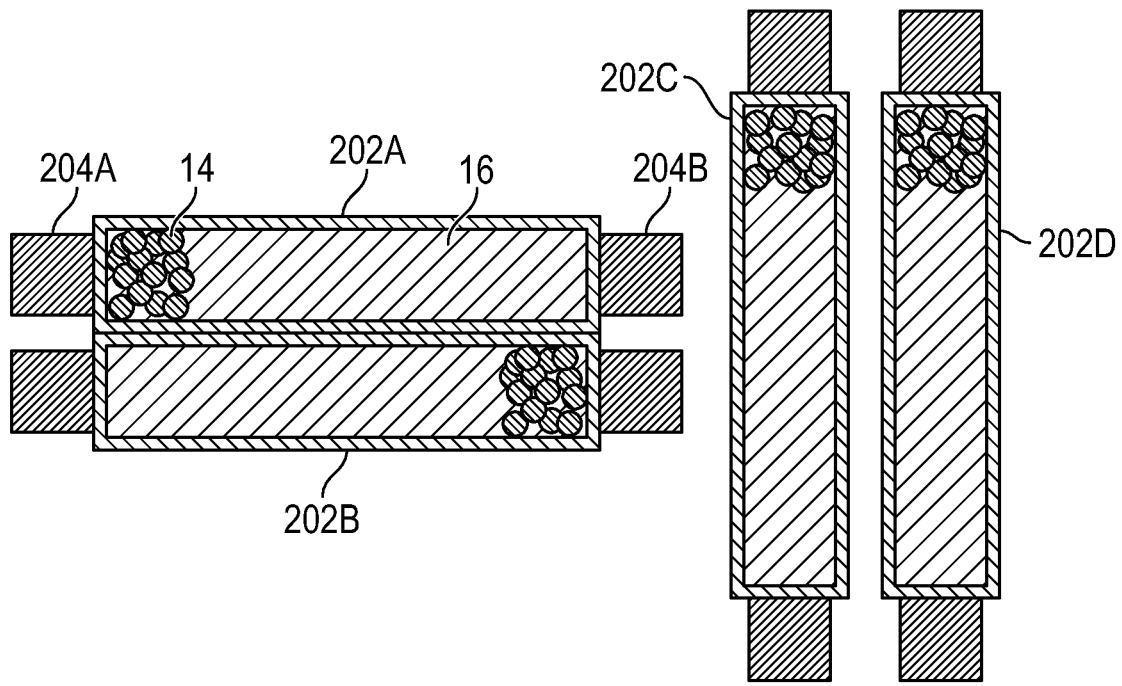

FIG. 18D illustrates the 4 enclosures 202A, 202B, 202C, 204D from FIG. 18C after exposure to a magnetic field. The magnetically sensitive particles 14 in enclosure 202C have moved from the initial position shown in FIG. 18C. This indicates exposure to a magnetic field from the direction where the magnetically sensitive particles 14 have moved to in the enclosure 202C. The positions of the magnetically sensitive particles 14 in the enclosures 202C and 202D shown in FIG. 18D together indicate a direction from which a magnetic field was applied. Any suitable detection technique can be used to determine positions of the magnetically sensitive particles 14 in the enclosures 202A, 202B, 202C, and 202D. A measurement circuit can output an indication of the applied magnetic field based on the detected positions of the magnetically sensitive particles in enclosures 202A, 202B, 202C, and 202D.

Figure 18E:
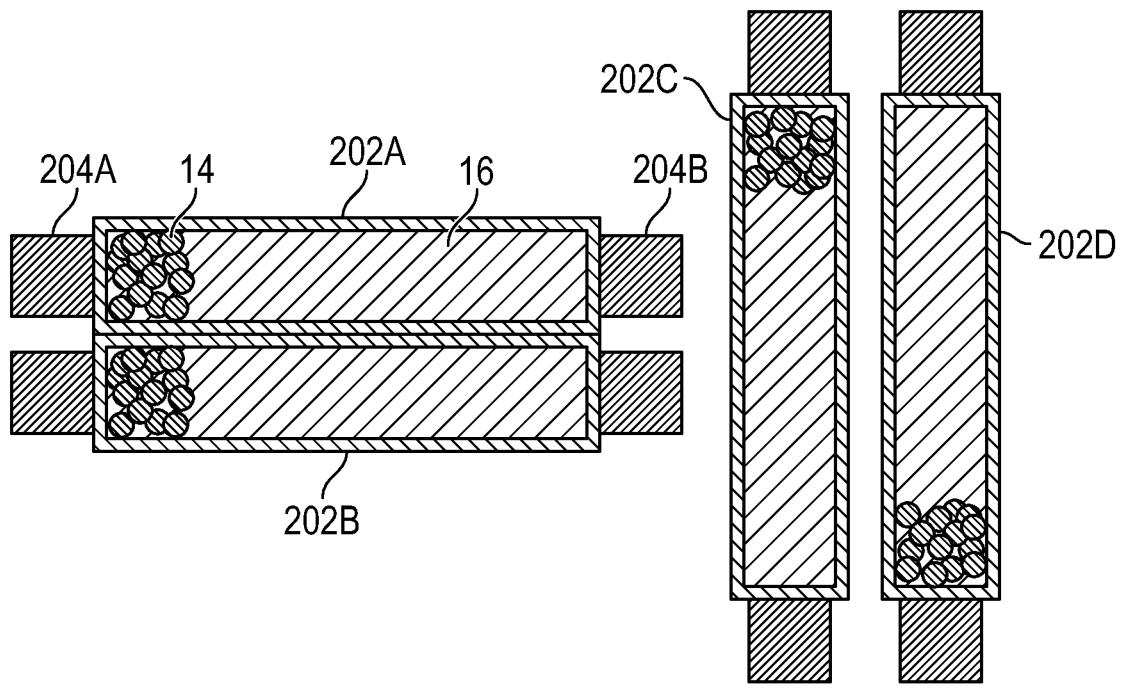

FIG. 18E illustrates the 4 enclosures 202A, 202B, 202C, 204D from FIG. 18C after exposure to a magnetic field from a different direction than in FIG. 18D. The magnetically sensitive particles 14 in enclosure 202B have moved from the initial position shown in FIG. 18C. This indicates exposure to a magnetic field from the direction where the magnetically sensitive particles 14 have moved to in the enclosure 202B. The positions of the magnetically sensitive particles 14 in the enclosures 202A and 202B shown in FIG. 18E together indicate the direction from which a magnetic field was applied.

Figure 18F:
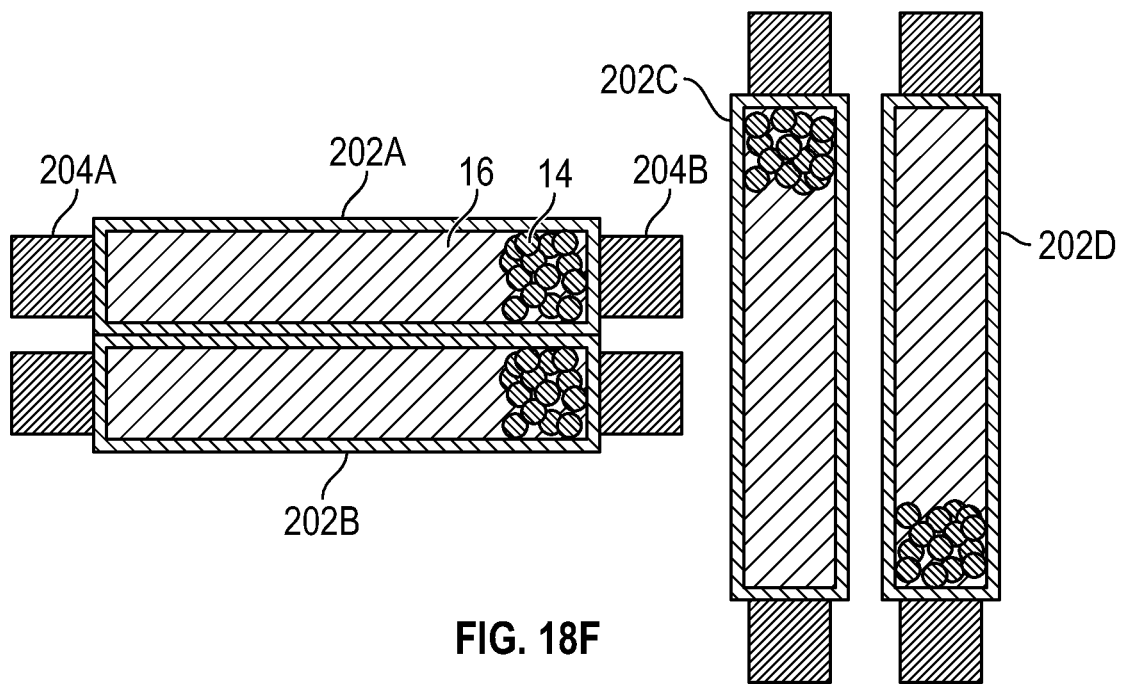

FIG. 18F illustrates the 4 enclosures 202A, 202B, 202C, 204D from FIG. 18E after exposure to magnetic fields from an opposite direction than in FIG. 18E. Two magnetic fields have been applied to bring the magnetically sensitive particles 14 to the position shown in FIG. 18E relative to the initial position in FIG. 18C. The magnetically sensitive particles 14 in enclosures 202A and 202B have moved from the position shown in FIG. 18E to an opposite end of these enclosures. This indicates exposure to a magnetic field from the direction where the magnetically sensitive particles 14 have moved to in the enclosures 202A and 202B. The positions of the magnetically sensitive particles 14 in the enclosures 202A and 202B shown in FIG. 18F together indicate the direction from which a magnetic field was applied. Applying magnetic fields in two opposite directions does not bring the magnetically sensitive particles in the enclosures 202A, 202B, 202C, 204D back to the initial position shown in FIG. 18C.

In some applications, systems disclosed herein can include a magnetic structure integrated with a container that retains magnetically sensitive particles. The magnetic structure can include a coil or meander shape to cause the magnetically sensitive particles to move in fluid within the container in a particular way and/or cluster in a particular area. This can cause a conductive channel to be formed or dispersed.

Figure 19A:
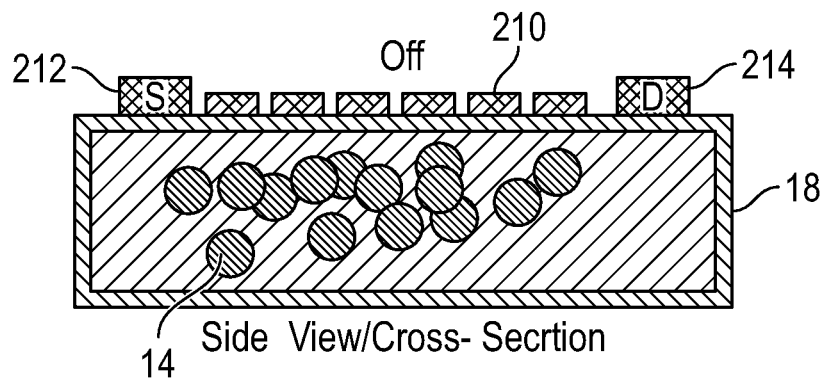
FIGS. 19A and 19B illustrate a system with an integrated magnetic structure that causes magnetically sensitive particles within fluid in a container to form a channel when activated.
Figure 19B:
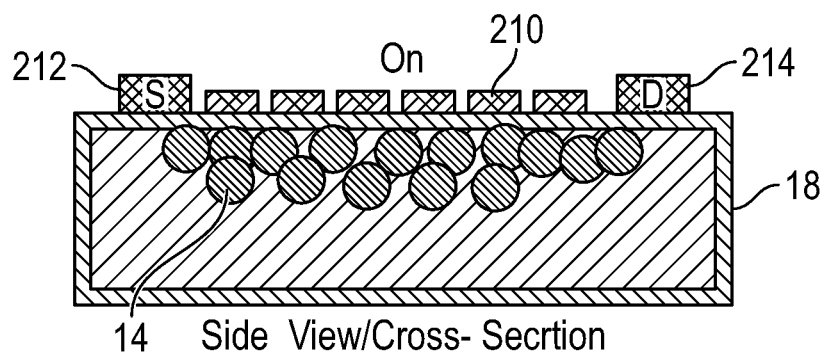

FIGS. 19A and 19B illustrate a system with an integrated magnetic structure 210 that causes magnetically sensitive particles 14 within fluid in a container 18 to form a channel when activated. The magnetic structure 210 can control the distribution of the magnetically sensitive particles 14, where the magnetically sensitive particles 14 are distributed when no current is flowing and the magnetically sensitive particles can gather proximate the magnetic structure 210 when current is flowing to provide a conductive channel between contacts 212 and 214 of the container 18. The contacts 212 and 214 can be conductive metal or metallic contacts.

When the magnetic structure 210 is not activated, for example, as shown in FIG. 19A, the magnetically sensitive particles 14 may not form a conductive channel. For example, the magnetically sensitive particles 14 can be distributed randomly within the container 18. As another example, the magnetically sensitive particles 14 can be located at initial positions that do not form a channel. With no channel, there is no conduction path between contacts 212 and 214 in FIG. 19A. The contacts 212 and 214 can be a source and a drain, respectively.

When the magnetic structure 210 is activated, for example, as shown in FIG. 19B, a conductive channel can be formed between the contacts 212 and 214 on the container 18. Magnetically sensitive particles 14 can align relative to magnetic field/lines of flux when the magnetic structure 210 is activated. The conductive channel can provide a conduction path between contacts 212 and 214. The magnetic structure 210 can be activated when current flows through the magnetic structure 210.

Figure 19C:
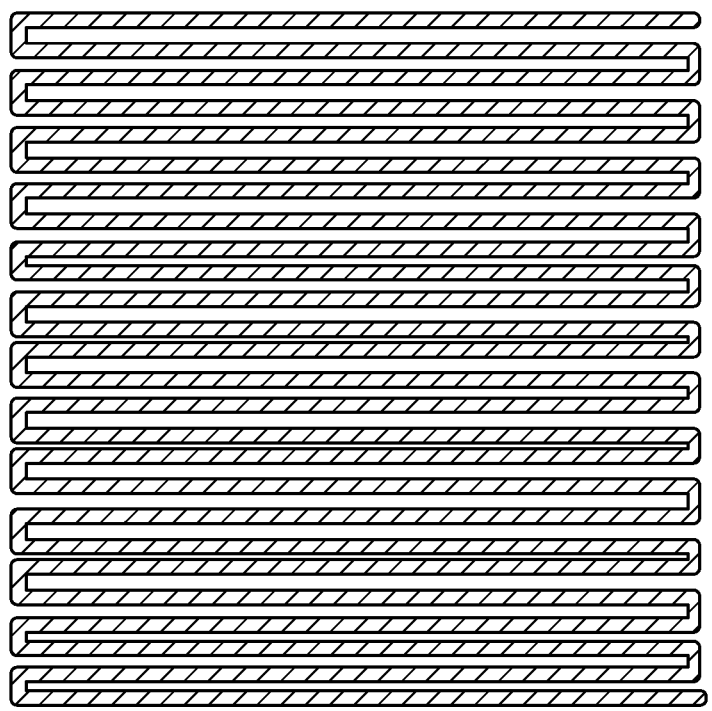
FIG. 19C is a plan view of a meander structure that can implement the magnetic structure and/or one or more other magnetic structures disclosed herein.

The magnetic structure 210 can include a coil or a meander structure. For example, FIG. 19C is a plan view of a meander structure that can implement the magnetic structure 210 and/or one or more other magnetic structures disclosed herein. A meander structure can create a gradient magnetic field. This can provide advantageous attraction of magnetically sensitive particles 14 depending on the specifics of the application.

A non-volatile switch can be implemented with magnetically sensitive particles in a container and an integrated magnetic structure. When magnetically sensitive particles are positioned to create a conductive channel between metal contacts, the non-volatile switch can be closed. FIG. 20A illustrates an example of a non-volatile switch 215 that is in a closed position. Depending on a magnetic pattern on a track, a default can be set. Van Der Waals force between magnetically sensitive particles 14 can enable and maintain connectivity. A magnetoresistive layer of a magnetic structure 217 can enable and maintain connectivity.

With a magnetic structure 217 (e.g., AMR, GMR, magnetoresistive random-access memory (MRAM), or racetrack magnetic layering technology), a magnetic field can be switched on, switched off, or moved. The magnetic structure 217 can function similar to a magnetic chuck in metal engineering. A race-track memory style can create the movement of magnetically sensitive particles 14 to the desired location (e.g., to close the non-volatile switch 215). The magnetically sensitive particles 14 can be moved to transition the non-volatile switch 215 from the closed position to an open position. FIG. 20B illustrates an open position of the non-volatile switch 215.

Different patterning within and/or outside a container can enable desirable functionality. For example, a certain patterned construction can, in an "on" state, adhere a certain density of magnetically sensitive particles to a specific location within a container that may take a certain impact/energy/magnetic field to overcome/move, etc. This can translate (via processing circuitry, etc.) to a specific value or threshold for monitoring in a specific application. Differently shaped particles can adhere and/or attach for a non-volatile switch. A modified topography of the magnetic structure for a particular particle shape and/or size can be selected to enhance and/or optimize responsiveness for a particular application. A functional coating can be implemented for magnetically sensitive particles implementing a non-volatile switch.

A module can incorporate energy harvesting based on movement of magnetically sensitive particles. This can enable an intermittent accumulation of energy that can be stored. The stored energy can be applied elsewhere in the system. A measurement of the accumulated charge can represent a signature that, for example, can infer a cumulative exposure to a magnetic body or another useful inference. An example of another useful inference is where a system sets a threshold/limit on a level of charge and an action is initiated in response to exceeding this level of charge.

Energy harvesting can be implemented using magnetically sensitive particles and/or ferrofluid droplets that are moved by an external magnetic field and consequently provide a dynamically changing contact area at an interface. This can result in a charge flow by contact electrification. As the magnetic field changes, so does the position of the magnetically sensitive particles and/or ferrofluidic droplets. There can be contact areas connecting from inside a container to external to the container.

A magnetic core can generate a magnetic field. The magnetic core can be stacked with a container that includes magnetically sensitive particles. The magnetically sensitive particles can be electrically conductive. The magnetically sensitive particles can move depending on the magnetic field generated. As the magnetically sensitive particles move and touch metal contacts, energy can be harvested.

Energy can be stored on one or more energy storing devices, such as one or more capacitors, for use in the part or for sending to one or more other parts of a system, such as a battery, components that consume a relatively small amount of power during operation, etc. Energy can be generated by continuous charge flow by contact electrification or triboelectric charging. The composition of the magnetically sensitive particles (e.g., one or more of coatings, composite structure, etc.) can be modified and optimized depending on the specifics of the application. For example, the composition of the magnetically sensitive particles can include a functional coating to enhance triboelectric charging.

FIGS. 21A, 21B, and 21C illustrate an example energy harvesting system 220. FIG. 21A is a bottom view of the energy harvesting system 220. FIG. 21B is a top view of the energy harvesting system 220. FIG. 21C is a side view of the energy harvesting system 220.

In the energy harvesting system 220, a magnetic core/transformer 222 can generate a magnetic field that causes magnetically sensitive particles 14 in a container 18 to move. This movement can generate energy, for example, by contact electrification. The generated energy can be stored by one or more capacitors 224. The energy stored by the one or more capacitors 224 can be used to power one or more components of the system 220 and/or provided to another system. As one example, the stored energy can power an application specific integrated circuit (ASIC) 225. The container 18 can be positioned on a bottom side of lead frame, or integrated/stacked within a SIP or module, for example. The container 18 can be as large as possible given area constraints. The magnetically sensitive particle 14 can come into contact with metal contacts 228. These metal contacts 228 can be electrically connected to lead connections 229. In some instances, the metal contacts 228 can be in direct physical contact with lead connections 229. A packaging structure, such as a mold compound 230, can be included to encapsulate components of the energy harvesting system 200. The shape, materials and construction of the particles and container can be optimized depending on the specifics of the application. For example, the particle coating can be selected along with a material (integrated with the inner surface of the container) such that any interaction or friction generates a charge that can be harvested, or the detection of a generated charge indicates a movement or cluster of particles—that can infer a property of an external magnetic field.

In some applications, a meander structure can be implemented to generate a magnetic field in an energy harvesting application. This can achieve precise contact points that follow the flow of a gradient magnetic field.

In certain applications, the container 18 can be exposed though an opening 232 in a packaging structure, for example, as shown in FIG. 21D.

CONCLUSION

In the embodiments described above, apparatus, systems, and methods are described in connection with particular embodiments. It will be understood, however, that the principles and advantages of the embodiments can be used for any other systems, apparatus, or methods that could benefit from any suitable principles and advantages disclosed herein.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments have been described, these embodiments have been presented by way of example only and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A system with particles that move in response to a magnetic field, the system comprising:
    a container;
    particles within the container;
    a semiconductor die integrated with the container; and
    a magnetic structure integrated with the container, the magnetic structure configured to magnetically interact with both an external magnetic field and the particles.

2. The system of claim 1, wherein the magnetic structure is a flux concentrator.

3. The system of claim 1, wherein the magnetic structure is configured to amplify the external magnetic field.

4. The system of claim 1, wherein the magnetic structure is a biasing magnet configured to hold the particles in position.

5. The system of claim 1, wherein the container comprises a cap, the magnetic structure is positioned on the cap, a packaged module includes the container and the magnetic structure, and the magnetic structure is exposed to an environment external to the packaged module.

6. The system of claim 1, further comprising a magnetic sensing structure integrated with the container, the magnetic sensing structure configured to detect the particles and to output an indication of the external magnetic field.

7. The system of claim 1, further comprising an optical sensor configured to detect the particles and to output an indication of the external magnetic field.

8. The system of claim 1, wherein the particles have a functional coating.

9. The system of claim 1, wherein the particles are in at least one of a fluid or a gel, and the system is configured to provide a discernible response to the external magnetic field.

10. The system of claim 1, wherein the container comprises an electrical connection between an internal surface of the container and external to the container.

11. The system of claim 1, further comprising an antenna configured to wirelessly transmit a signal associated with the external magnetic field.

12. A method of magnetic field detection, the method comprising:
    modifying an external magnetic field with a magnetic structure that is integrated with a container, wherein magnetically sensitive particles within the container move in response to the modified magnetic field to provide a discernible response to the external magnetic field;
    after the modifying, detecting the magnetically sensitive particles within the container; and
    outputting a signal indicative of the external magnetic field based on the detecting.

13. The method of claim 12, wherein the modifying comprises concentrating magnetic flux of the external magnetic field.

14. The method of claim 12, wherein the detecting is performed with a magnetic sensing structure that is integrated with the container.

15. The method of claim 12, wherein the container and the magnetic structure are included in a packaged module, and the magnetic structure is exposed to an environment external to the packaged module.

16. The method of claim 12, wherein the signal indicative of the external magnetic field is indicative of at least one of an intensity of the external magnetic field, a direction of the external magnetic field, or a position of a magnetic body that generates the external magnetic field.

17. The method of claim 12, further comprising resetting positions of the magnetically sensitive particles after the detecting.

18. A system with particles that move in response to a magnetic field, the system comprising:
    a container;
    particles within the container, wherein the particles are in at least one of a fluid or a gel; and
    a magnetic structure integrated with the container, the magnetic structure configured to magnetically interact with both an external magnetic field and the particles and deliver a discernible response to the external magnetic field.

19. The system of claim 18, wherein the magnetic structure has a fixed position relative to the container.

20. The system of claim 18, wherein the particles are micrometer scale or larger.

* * * * *